(12) United States Patent
Feng et al.

(10) Patent No.: US 11,222,577 B2
(45) Date of Patent: Jan. 11, 2022

(54) SHIFT REGISTER UNIT, GATE DRIVING CIRCUIT AND METHOD THEREOF AND DISPLAY DEVICE

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN); Xing Zhang, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/982,148

(22) PCT Filed: Apr. 8, 2020

(86) PCT No.: PCT/CN2020/083709
§ 371 (c)(1),
(2) Date: Sep. 18, 2020

(87) PCT Pub. No.: WO2020/207404
PCT Pub. Date: Oct. 15, 2020

(65) Prior Publication Data
US 2021/0209995 A1  Jul. 8, 2021

(30) Foreign Application Priority Data
Apr. 11, 2019 (CN) .......................... 201910291915.5

(51) Int. Cl.
G09G 3/20 (2006.01)
G11C 19/28 (2006.01)

(52) U.S. Cl.
CPC ........... *G09G 3/2092* (2013.01); *G11C 19/28* (2013.01); *G09G 2310/0286* (2013.01)

(58) Field of Classification Search
CPC ............. G09G 3/2092; G09G 2320/04; G09G 2330/12; G09G 2310/0286; G11C 19/28
See application file for complete search history.

(56) References Cited

U.S. PATENT DOCUMENTS 8,994,629 B2  3/2015 Kim
9,190,169 B2  11/2015 Han et al.
(Continued)

FOREIGN PATENT DOCUMENTS

CN  101567160 A  10/2009
CN  102708815 A  10/2012
(Continued)

OTHER PUBLICATIONS

First Office Action, including Search Report, for Chinese Patent Application No. 201910291915.5, dated Apr. 20, 2021, 23 pages.

*Primary Examiner* — Robert J Michaud
(74) *Attorney, Agent, or Firm* — Westman, Champlin & Koehler, P.A.

(57) ABSTRACT

The present disclosure provides a shift register unit, a gate driving circuit and compensation method and driving method thereof, and a display device. The shift register unit includes: a shift register circuit having a detection node, the shift register circuit is configured to receive an input signal and a clock signal, and generate an output signal based on the clock signal under control of the input signal; and a detection circuit coupled to the detection node of the shift register circuit, the detection circuit is configured to generate a detection signal based on a potential of the detection node.

20 Claims, 18 Drawing Sheets

(56) References Cited

U.S. PATENT DOCUMENTS

| | | |
|---|---|---|
| 10,204,580 B2 | 2/2019 | Dai |
| 2014/0085285 A1 | 3/2014 | Kim |
| 2014/0091997 A1 | 4/2014 | Han et al. |
| 2016/0104407 A1 | 4/2016 | Hong et al. |
| 2017/0132984 A1 | 5/2017 | Dai |
| 2017/0235406 A1* | 8/2017 | Su .................... G06F 3/0412 |
| | | 345/173 |
| 2018/0025695 A1* | 1/2018 | Han .................... G09G 3/3677 |
| | | 345/213 |
| 2020/0090571 A1 | 3/2020 | Li et al. |

FOREIGN PATENT DOCUMENTS

| | | |
|---|---|---|
| CN | 103700333 A | 4/2014 |
| CN | 103714770 A | 4/2014 |
| CN | 104183225 A | 12/2014 |
| CN | 105304041 A | 2/2016 |
| CN | 106384578 A | 2/2017 |
| CN | 107068033 A | 8/2017 |
| CN | 108648718 A | 10/2018 |
| CN | 109036254 A | 12/2018 |
| CN | 109256082 A | 1/2019 |
| CN | 109346007 A | 2/2019 |
| EP | 3832637 A1 | 6/2021 |
| KR | 20090013514 A | 2/2009 |
| KR | 20160035193 A | 3/2016 |

\* cited by examiner

SHIFT REGISTER UNIT, GATE DRIVING CIRCUIT AND METHOD THEREOF AND DISPLAY DEVICE

CROSS-REFERENCE TO RELATED APPLICATION

This application is a Section 371 National Stage Application of International Application No. PCT/CN2020/083709 filed on Apr. 8, 2020, entitled "SHIFT REGISTER UNIT, GATE DRIVING CIRCUIT AND METHOD THEREOF AND DISPLAY DEVICE", which claims priority to Chinese Patent Application No. 201910291915.5, filed on Apr. 11, 2019, the disclosures of which are incorporated herein by reference in their entireties.

TECHNICAL FIELD

The present disclosure relates to the field of display, and particularly to a shift register unit, a gate driving circuit and compensation method and driving method thereof, and a display device.

BACKGROUND

In a conventional display device, the gate driving circuit includes multiple stages of shift register units, and the output signal generated by each stage of the shift register unit is used to drive the corresponding row of the pixel units on the display panel. Due to factors such as manufacturing process, the voltage of one or some nodes in the shift register unit may be abnormal, resulting in abnormal output signals, thereby affecting the display.

SUMMARY

Embodiments of the present disclosure provide a shift register unit, a gate driving circuit and compensation method and driving method thereof, and a display device, so that the abnormal potential of the internal nodes of the shift register unit in the gate driving circuit can be detected.

According to an aspect of the embodiments of the present disclosure, there is provided a shift register unit, comprising:

a shift register circuit having a detection node, the shift register circuit is configured to receive an input signal and a clock signal, and generate an output signal based on the clock signal under control of the input signal; and a detection circuit coupled to the detection node of the shift register circuit, the detection circuit is configured to generate a detection signal based on a potential of the detection node.

In an example, the detection circuit comprises:

a sample and hold sub-circuit coupled to the detection node, the sample and hold sub-circuit is configured to sample and hold the potential of the detection node to obtain a sample signal; and an analog-to-digital conversion sub-circuit configured to perform analog-to-digital conversion on the sample signal from the sample and hold sub-circuit to obtain the detection signal.

In an example, the detection circuit further comprises: a switch sub-circuit coupled between the sample and hold sub-circuit and the detection node, the switch sub-circuit is configured to connect the sample and hold sub-circuit with the detection node or disconnect the sample and hold sub-circuit from the detection node, under a control of a switching signal.

In an example, shift register unit comprises a plurality of detection circuits and a plurality of detection nodes coupled in a one-to-one correspondence, each detection circuit is configured to generate the detection signal based on the potential of the detection node coupled to the detection circuit.

In an example, the shift register circuit comprises:

an input sub-circuit coupled to a pull-up node and an input signal terminal of the shift register circuit, the input sub-circuit is configured to receive an input signal from the input signal terminal and output the input signal to the pull-up node;

an output sub-circuit coupled to the pull-up node, and an clock signal terminal and an output signal terminal of the shift register circuit, the output sub-circuit is configured to receive a clock signal from the clock signal terminal, and provide an output signal to the output signal terminal based on the received clock signal under a control of a potential of the pull-up node;

a pull-down sub-circuit coupled to the output signal terminal and a pull-down node of the shift register circuit, the pull-down sub-circuit is configured to control a potential of the output signal terminal under a control of a potential of the pull-down node; and a pull-down control sub-circuit coupled to the pull-up node, the pull-down node, and a power signal terminal, the pull-down control sub-circuit is configured to control the potential of the pull-down node under the control of the potential of the pull-up node and a potential of the power signal terminal.

In an example, the detection node comprises at least one of the pull-down node and the output signal terminal of the shift register circuit.

According to another aspect of the embodiments of the present disclosure, there is provided a gate driving circuit, comprising:

N stages of cascaded shift register units, at least one shift register unit of the N stages of cascaded shift register units is used as a unit to be tested, wherein N is an integer greater than 1;

wherein at least one detection unit, with each detection unit being implemented by the above described shift register unit, is provided adjacent to each unit to be tested, each unit to be tested has a same structure as that of the shift register circuit of the detection unit adjacent to said each unit to be tested, and each unit to be tested is coupled in the same manner as the shift register circuit of the detection unit adjacent to said each unit to be tested, in terms of signal terminals except for output signal terminal.

In an example, a detection unit with output signal terminal being detection node is provided at a next stage of an Nth stage of the shift register unit, or provided at a previous stage of a first stage of the shift register unit.

In an example, each detection unit is coupled to a load circuit at the output signal terminal of the shift register circuit in said detection unit, and the load circuit has a same structure as that of a load circuit coupled to the unit to be tested adjacent to said detection unit.

In an example, the gate driving circuit comprises a plurality of units to be tested, the plurality of units to be tested are distributed among a head portion, a middle portion, and a tail portion of the N stages.

According to another aspect of the embodiments of the present disclosure, there is provided a display device comprising: the above described gate driving circuit.

In an example, the display device further comprising: a plurality of rows of pixel units coupled to a plurality of output signal terminals in the gate driving circuit respectively, wherein the output signal terminal of each detection unit is coupled to a row of pixel units adjacent to a row of pixel units coupled to an output signal terminal of a corresponding unit to be tested.

In an example, the a plurality of rows of pixel units comprises a plurality of rows of display pixel units and a plurality of rows of auxiliary pixel units, wherein a signal output terminal of the detection unit with output signal terminal being detection node is coupled to a corresponding row of auxiliary pixel units.

According to another aspect of the embodiments of the present disclosure, there is provided compensation method applied to the above described gate driving circuit, comprising:

receiving a detection signal from a detection unit of the gate driving circuit to obtain a potential of a detection node from the detection signal; and adjusting a potential of a signal terminal for controlling the potential of the detection node according to the potential of the detection node.

In an example, receiving a detection signal from a detection unit of the gate driving circuit to obtain a potential of a detection node from the detection signal comprises:

receiving a detection signal from the detection unit of the gate driving circuit at a first time to obtain a potential of the detection node at the first time from the received detection signal; and receiving a detection signal from the detection unit of the gate driving circuit at a second time to obtain a potential of the detection node at the second time from the received detection signal.

In an example, the gate driving circuit comprises one detection unit, and adjusting a potential of a signal terminal for controlling the potential of the detection node according to the potential of the detection node comprises:

calculating a difference value between the potential of the detection node at the first time and the potential of the detection node at the second time; and adjusting the potential of the signal terminal for controlling the potential of the detection node based on the difference value.

In an example, the gate driving circuit comprises a plurality of detection units, each detection unit comprises one or more types of detection nodes, and adjusting a potential of a signal terminal for controlling the potential of the detection node according to the potential of the detection node comprises: for each type of detection node, calculating a difference value between a potential of said each type of detection node at the first time and a potential of said each type of detection node at the second time in each detection unit;

averaging difference values of the plurality of detection units to obtain an average value of the difference values; and adjusting the potential of the signal terminal for controlling the potential of the type of detection node in each detection unit based on the average value of the difference values.

In an example, adjusting a potential of a signal terminal for controlling the potential of the detection node according to the potential of the detection node further comprises:

before averaging difference values of the plurality of detection units, determining whether the potential of the detection node obtained from each detection unit exceeds a predetermined range, and if the potential of the detection node obtained from each detection unit exceeds the predetermined range, determining that the potential of the detection node obtained from the detection unit is an abnormal value and removing the abnormal value.

In an example, if the detection node is a pull-down node of the shift register circuit, a power signal terminal in the shift register circuit is determined as the signal terminal for controlling the potential of the detection node; if the detection node is an output signal terminal of the shift register circuit, a clock signal terminal of the shift register circuit is determined as the signal terminal for controlling the potential of the detection node.

DETAILED DESCRIPTION OF EMBODIMENTS

Although the present disclosure will be fully described with reference to the accompanying drawings containing embodiments of the present disclosure, it should be understood that those of ordinary skill in the art can modify the disclosure described herein while obtaining the technical effects of the present disclosure. Therefore, it should be understood that the above description is a broad disclosure for those of ordinary skill in the art, and its content is not intended to limit the exemplary embodiments described in the present disclosure.

In addition, in the following detailed description, for the convenience of explanation, many specific details are set forth to provide a comprehensive understanding of the embodiments of the present disclosure. Obviously, however, one or more embodiments can also be implemented without these specific details.

The embodiment of the present disclosure provides a shift register unit, a gate driving circuit and compensation method and driving method thereof, and a display device, so that the abnormal potential of the internal nodes of the shift register unit in the gate driving circuit can be detected.

Figure 1:
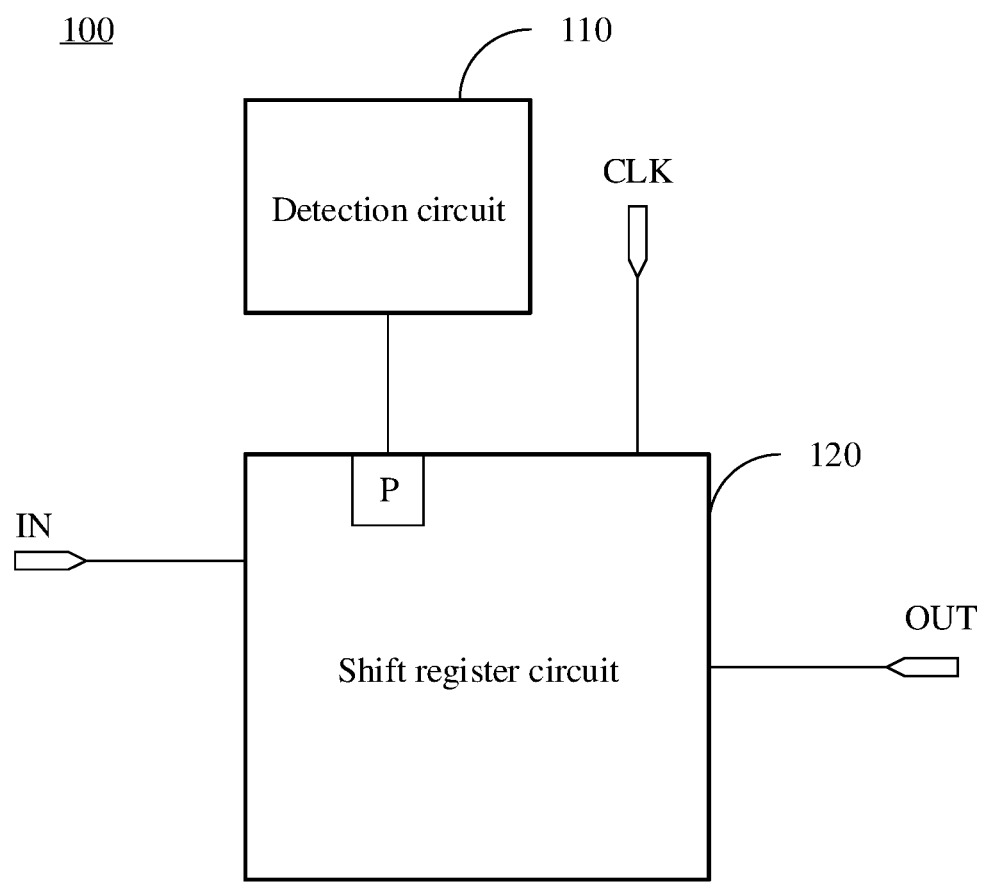
FIG. 1 shows a schematic block diagram of a shift register unit according to an embodiment of the present disclosure.

FIG. 1 shows a schematic block diagram of a shift register unit according to an embodiment of the present disclosure.

As shown in FIG. 1, the shift register unit 100 includes a detection circuit 110 and a shift register circuit 120.

The shift register circuit 120 has a detection node P. The detection node P may be any node in the shift register circuit 120, such as, but not limited to, a pull-up node, a pull-down node, an output signal terminal, etc. As shown in FIG. 1, the shift register circuit 120 may receive an input signal from the input terminal IN, receive a clock signal from the clock signal terminal CLK, and generate an output signal based on the clock signal under the control of the input signal to be output to the output signal terminal OUT.

The detection circuit 110 is coupled to the detection node P of the shift register circuit 120. The detection circuit 110 may generate a detection signal based on the potential of the detection node P.

The shift register unit 100 of the embodiment of the present disclosure may be used as a detection unit to be distributed in the gate driving circuit. By using the detection circuit 110 to acquire the potential of the detection node in the detection unit, the potential of the corresponding node in the shift register unit of the gate driving circuit may be acquired, so that the abnormal potential of the node in the shift register unit of the gate driving circuit may be detected.

Figure 2:
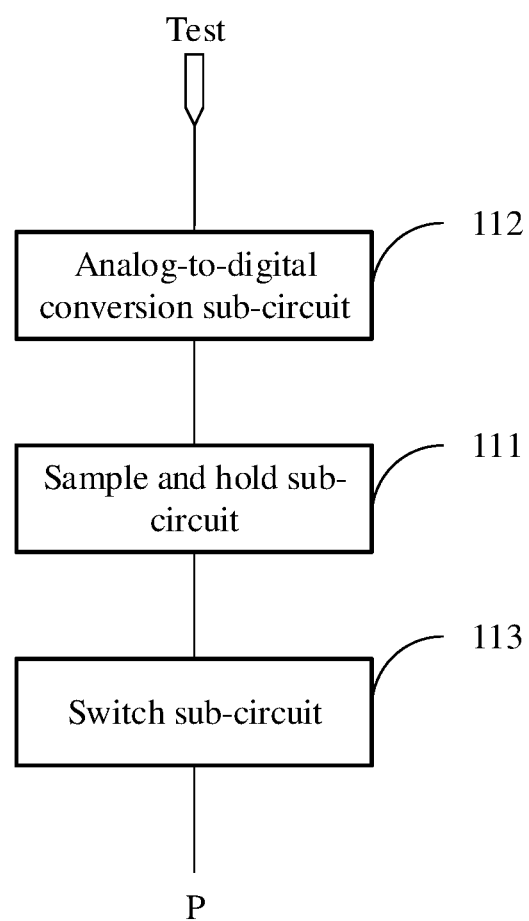
FIG. 2 shows a schematic block diagram of a detection circuit of a shift register unit according to an embodiment of the present disclosure.

FIG. 2 shows a schematic block diagram of a detection circuit of a shift register unit according to an embodiment of the present disclosure. As shown in FIG. 2, the detection circuit may include a sample and hold sub-circuit 111 and an analog-to-digital conversion sub-circuit 112.

The sample and hold sub-circuit 111 may be implemented as a sampling holder. The sample and hold sub-circuit 111 is coupled to the detection node P, and the sample and hold sub-circuit 111 may sample and hold the potential of the detection node P to obtain a sample signal. The analog-to-digital conversion sub-circuit 112 may be implemented as an analog-to-digital converter ADC. The analog-to-digital conversion sub-circuit 112 performs analog-to-digital conversion on the sample signal from the sample and hold sub-circuit 111 to obtain a detection signal. The detection signal may be output to the detection signal terminal Test for subsequent detection and compensation of abnormal potentials.

In some embodiments, the detection circuit may further include a switch sub-circuit 113. The switch sub-circuit 113 is coupled between the sample and hold sub-circuit 112 and the detection node P. The switch sub-circuit 113 can connect the sample and hold sub-circuit 112 to or disconnect the sample and hold sub-circuit 112 from the detection node P, under the control of the switching signal. The switch sub-circuit 113 may be implemented as a control switch. By setting the switch sub-circuit 113, the potential of the detection node P may be collected as needed to realize more flexible data collection.

Figure 3:
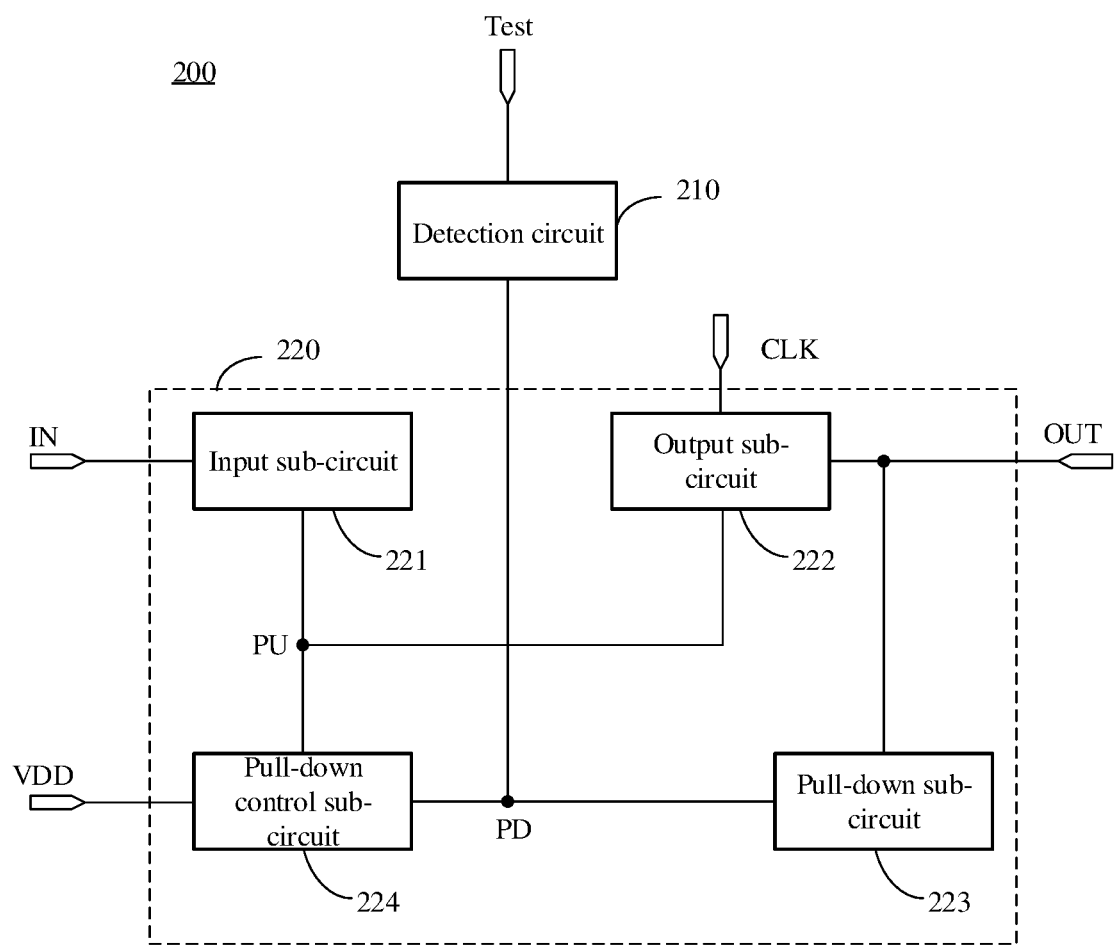
FIG. 3 shows a schematic block diagram of a shift register unit according to another embodiment of the present disclosure.

FIG. 3 shows a schematic block diagram of a shift register unit according to another embodiment of the present disclosure.

As shown in FIG. 3, the shift register unit 200 includes a detection circuit 210 and a shift register circuit 220.

The detection circuit 210 may have the structure described above with reference to FIG. 2, which will not be repeated here.

The shift register circuit 220 includes an input sub-circuit 221, an output sub-circuit 222, a pull-down sub-circuit 223, and a pull-down control sub-circuit 224. The input sub-circuit 221 is coupled to a pull-up node PU and an input signal terminal IN. The input sub-circuit 221 may receive an input signal from the input signal terminal IN and output the input signal to the pull-up node PU. The output sub-circuit 222 is coupled to a pull-up node PU, the clock signal terminal CLK, and the output signal terminal OUT. The output sub-circuit 222 may receive a clock signal from the clock signal terminal CLK, and provide an output signal to the output signal terminal OUT based on the received clock signal under the control of the potential of the pull-up node PU. The pull-down sub-circuit 223 is coupled to the output signal terminal OUT and the pull-down node PD. The pull-down sub-circuit 223 may control the potential of the output signal terminal OUT under the control of the potential of the pull-down node PD. The pull-down control sub-circuit 224 is coupled to the pull-up node PU, the pull-down node PD, and the power signal terminal VDD. The pull-down control sub-circuit 224 may control the potential of the pull-down node PD under the control of the potentials of the pull-up node PU and the power signal terminal VDD.

In FIG. 3, the pull-down node PD is used as a detection node, and the detection circuit 210 is coupled to the pull-down node PD, so that a detection signal may be generated based on the potential of the pull-down node PD to be output to the detection signal terminal Test. The generated detection signal may be used to adjust the potential of the power signal terminal VDD. Of course, the number of detection nodes is not limited to one, but may be two or more. For example, the detection node may include a pull-down node PD and an output signal terminal OUT. The number of detection circuits 210 is the same as the number of detection nodes, and each detection circuit 210 is coupled to a corresponding detection node to generate a corresponding detection signal based on the potential of the coupled detection node, which will be described in detail below.

Figure 4:
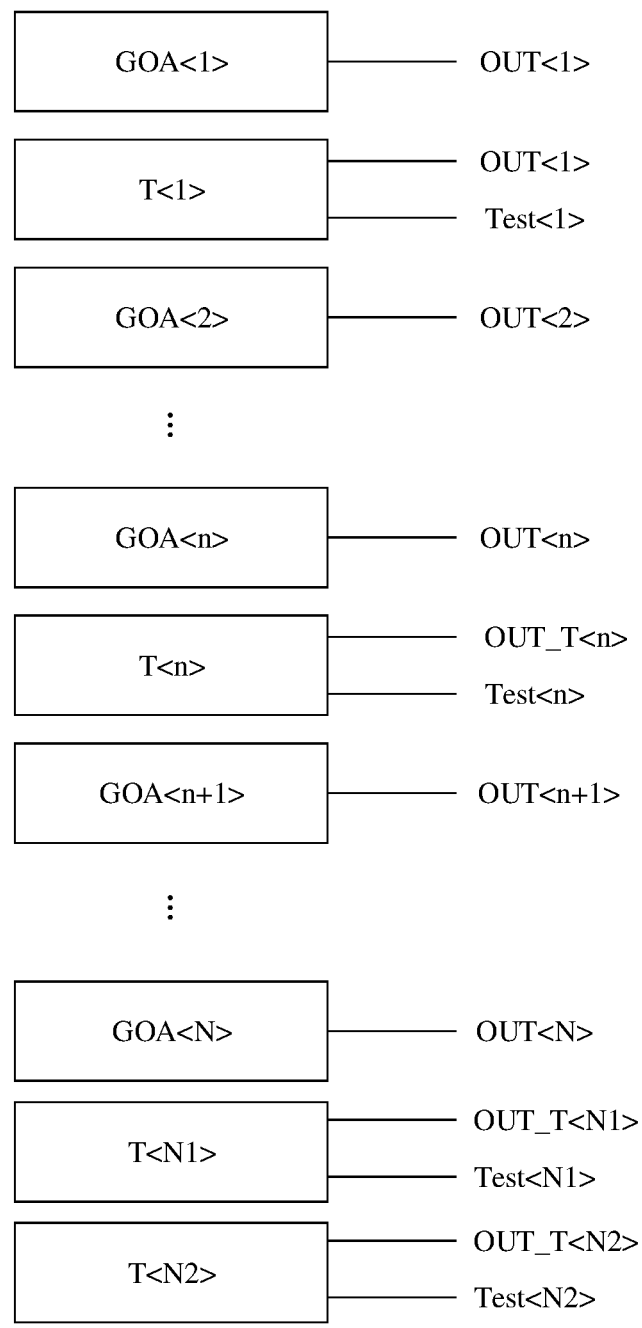
FIG. 4 shows a schematic diagram of a gate driving circuit according to an embodiment of the present disclosure.

FIG. 4 shows a schematic diagram of a gate driving circuit according to an embodiment of the present disclosure.

As shown in FIG. 4, the gate driving circuit 300 includes N stages of cascaded shift register units GOA<1>, GOA<2>, . . . , GOA<N>, where N is an integer greater than 1. At least one of the shift register units GOA<1>, GOA<2>, . . . , GOA<N> is used as the unit to be tested (also referred to as a first shift register unit), and at least one shift register unit (also referred to as a second shift register unit) described with reference to FIGS. 1 to 3 as a detection unit is arranged adjacent to the unit to be tested.

For example, in FIG. 4, shift register units GOA<1>, GOA<n>, and GOA<N> are used as the units to be tested, where n is an integer, and 1≤n≤N. A detection unit T<1> is provided at the next stage of the shift register unit GOA<1>, a detection unit T<n> is provided at the next stage of the shift register unit GOA<n>, and detection units T<N1> and T<N2> are provided at the next stage of the shift register unit GOA<N>. However, the embodiments of the present disclosure are not limited to this, and any one or more of the shift register units GOA<1>, GOA<2>, ..., GOA<N> may be selected as the unit to be tested as required. As an example, the shift register unit located in the middle of the N stage may be selected as the unit to be tested. For example, in the case of N=4320, the shift register units GOA<2021> and GOA<2022> may be used as the unit to be tested (the first shift register unit), and detection units (the second shift register unit) are provided at the next stage of the shift register units GOA<2021> and GOA<2022>, respectively. As another example, the shift register units located at the stage of the head, the middle, and the tail of the N stage may be selected as the unit to be tested. For example, when N=4320, the shift register unit GOA<10>, GOA<2022>, and GOA<4309> are used as the unit to be tested (the first shift register unit), and detection units (the second shift register unit) are provided at the next stage of the shift register units GOA<10>, GOA<2022>, and GOA<4309>, respectively.

The detection unit T<1> provides an output signal OUT_T<1> and a detection signal Test<1> about the shift register unit GOA<1>; the detection unit T<n> provides an output signal OUT_T<n> and a detection signal Test<n> about the shift register unit GOA<n>; the detection unit T<N1> provides an output signal OUT_T<N1> and a detection signal Test<N1> about the shift register unit GOA<N>; the detection unit T<N2> provides an output signal OUT_T<N2> and a detection signal Test<N2> about the shift register unit GOA<N>.

Although the detection unit is provided at the next stage of the unit to be tested in the above embodiments, the embodiments of the present disclosure are not limited to this, and the detection unit may also be provided at the previous stage of the unit to be tested in some embodiments.

In FIG. 4, each unit to be tested has the same structure as that of the shift register circuit of the adjacent detection unit, and each unit to be test is coupled in the same manner as the shift register circuit of the adjacent detection unit in terms of signal terminals except for output signal terminal. For example, the shift register circuit of the detection unit T<1> has the same structure as the shift register unit GOA<1>, and has signal terminals except for output signal terminal being coupled in the same manner as signal terminals except for output signal terminal of the shift register unit GOA<1> The shift register circuit of the detection unit T<n> has the same structure as the shift register unit GOA<n>, and has signal terminals except for output signal terminal being coupled in the same manner as signal terminals except for output signal terminal of the shift register unit GOA<n>. Each of the shift register circuits of the detection units T<N1> and T<N2> has the same structure as that of the shift register unit GOA<N>, and has signal terminals except for output signal terminal being coupled in the same manner as the shift register unit GOA<N>. This will be described in detail below.

In some embodiments, if the detection nodes of the detection unit (such as the detection units T<N1> and T<N2> in FIG. 4) include the output signal terminal, such a detection unit may be provided at the next stage the shift register unit GOA<N> or the previous stage of the shift register unit GOA<1>. For example, the detection units T<N1> and T<N2> in FIG. 4 are provided at the next stage of the shift register unit GOA<N>. In this way, it is possible to avoid the impact on the display due to the collection of detection signals at the output signal terminals of the detection units T<N1> and T<N2>. Of course, if the detection node of the detection unit does not include an output signal terminal, the detection unit may be provided at the previous stage or next stage of any stage of the shift register unit in the N stages of the shift register units as required, without affecting the display.

Hereinafter, the gate driving circuit of the embodiment of the present disclosure will be further described in detail with reference to FIGS. 5A to 7B.

Figure 5A:
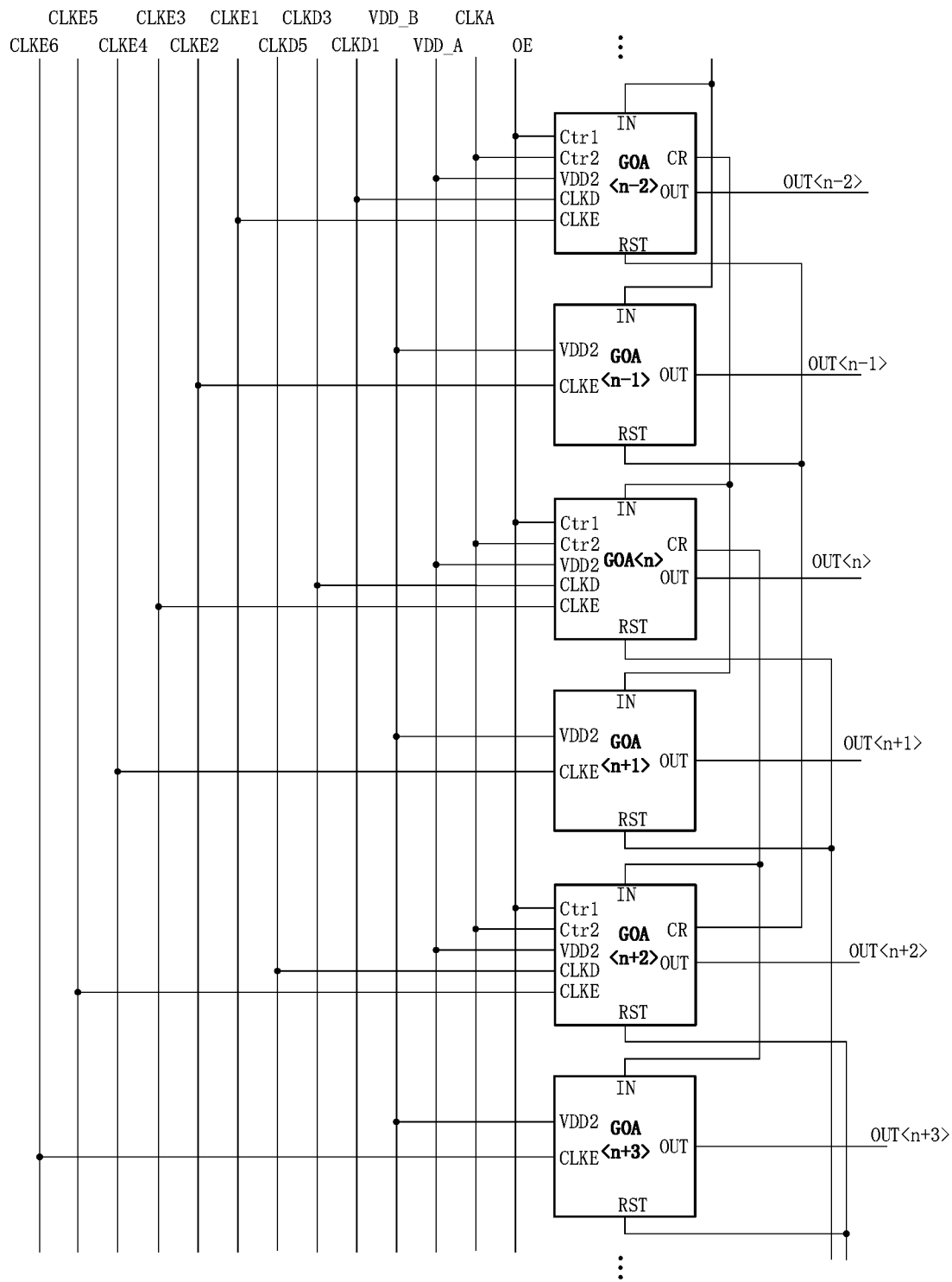
FIG. 5A shows a schematic structural diagram of a gate driving circuit without a detection unit according to an embodiment of the present disclosure.
Figure 5B:
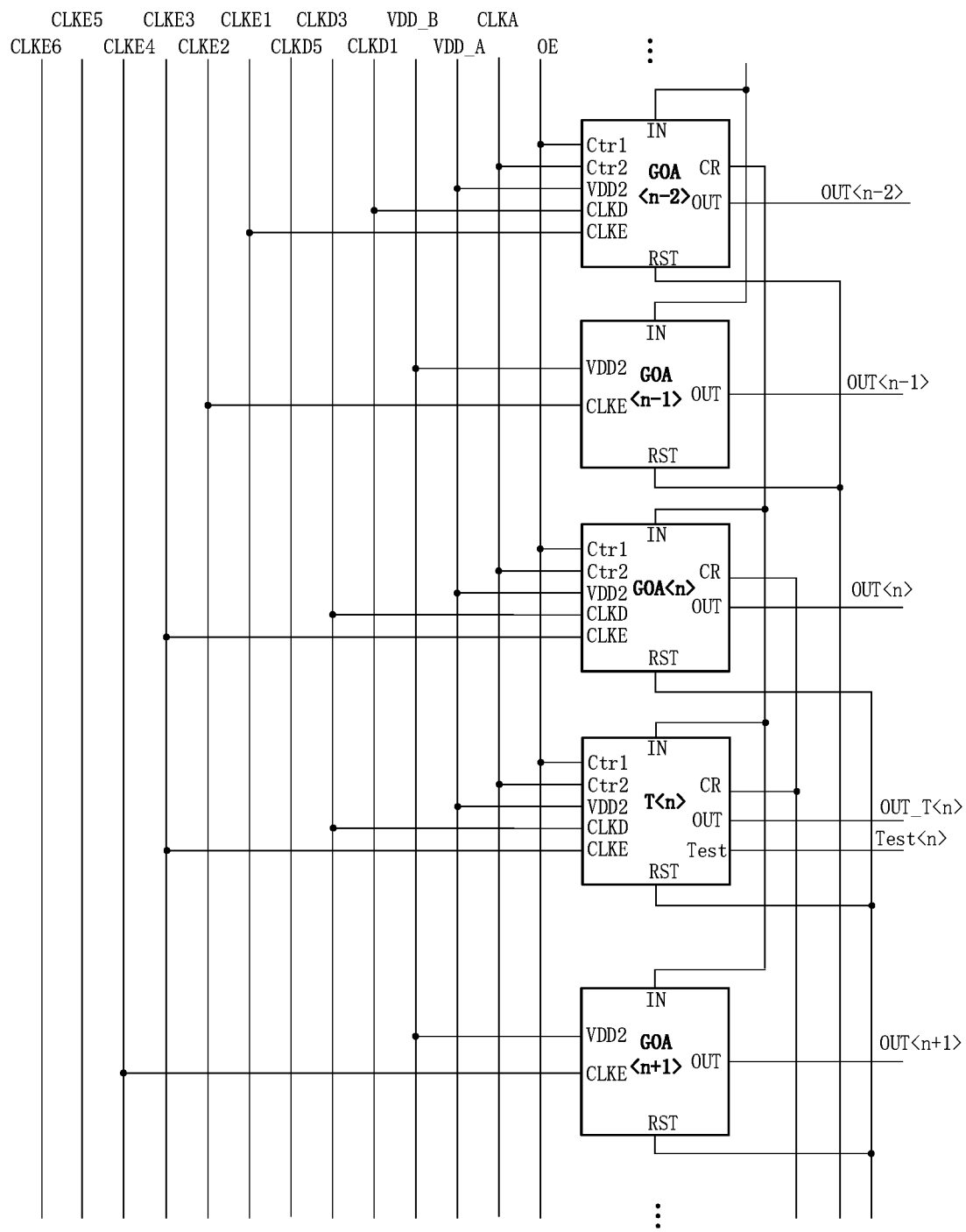
FIG. 5B shows a schematic structural diagram of a gate driving circuit with a detection unit according to an embodiment of the present disclosure.

FIG. 5A shows a schematic structural diagram of a gate driving circuit without a detection unit added according to an embodiment of the present disclosure. FIG. 5B shows a schematic structural diagram of a gate driving circuit with a detection unit added according to an embodiment of the present disclosure.

As shown in FIG. 5A, the gate driving circuit includes N stages of cascaded shift register units GOA. For brevity, FIG. 5A only shows six stages of shift register units GOA<n−2> to GOA<n+3>, the remaining shift register units are coupled in groups of six in the same manner. The shift register units GOA<n−2>, GOA<n>, and GOA<n+2> in FIG. 5A as the odd-numbered shift register units have the same circuit structure. The shift register units GOA<n−1>, GOA<n+1>, and GOA<n+3> as even-numbered shift register units have the same circuit structure. It should be clear to those skilled in the art that the so-called even number and odd number here are for ease of description, and the two may be used interchangeably.

As shown in FIG. 5A, each odd-numbered stage of shift register unit has a first control signal terminal Ctr1 coupled to receive a first control signal OE, a second control signal terminal Ctr2 is coupled to receive a second control signal CLKA, and a power signal terminal VDD2 coupled to receive a power signal VDD_A. The power signal terminal VDD2 of each even-numbered shift register unit is coupled to receive a power signal VDD_B. The input signal terminals IN of the shift register units GOA<n> and GOA<n+1> are coupled to the control output terminal CR of the shift register unit GOA<n−2>, reset signal terminals RST of the shift register unit GOA<n> and GOA<n+1> are coupled to the control output terminal CR of the shift register unit GOA<n+4>.

In FIG. 5A, clock signals CLKD1, CLKD3, CLKD5, CLKE1, CLKE2, CLKE3, CLKE4, CLKE5, and CLKE6 are configured to control each group of six shift register units, where the shift register unit GOA<n−2> has a first clock signal terminal CLKD coupled to receive a clock signal CLKD1, and a second clock signal terminal CLKE coupled to receive a clock signal CLKE1. The shift register unit GOA<n−1> has a second clock signal terminal CLKE coupled to receive a clock signal CLKE2, and so on, and will not repeat them here.

A detection unit T may be provided in the gate driving circuit of FIG. 5A.

For example, as shown in FIG. 5B, the shift register unit GOA<n> is used as the unit to be tested, and a detection unit T<n> is provided at the next stage of the shift register unit GOA<n> to provide an output signal OUT_T<n> and a detection signal Test<n>. The detection unit T<n> may be implemented by the shift register unit described above with reference to FIGS. 1 to 3, and has a shift register circuit and a detection circuit. The shift register circuit of the detection unit T<n> has the same structure as that of the shift register unit GOA<n>, and has signal terminals except for output signal terminal being coupled in the same manner as those of the shift register unit GOA<n>. As shown in FIG. 5B, the detection unit T<n> is coupled in the same manner as that of the shift register unit GOA<n> in terms of first control signal terminal Ctr1, second control signal terminal Ctr2, power signal terminal VDD2, first clock signal terminal CLKD, second clock signal terminal CLKE, input signal terminal IN, and control output terminal CR. The output signal terminal of GOA<n> may be coupled to a load circuit, and the output signal terminal of the detection unit T<n> may be coupled to another load circuit that is the same as the load circuit. In addition, the output signal terminal of GOA<n> may be coupled to a corresponding row of pixel units on the display panel, and the output signal terminal of the detection unit T<n> may be coupled to the next row of pixel units of the row of pixel units.

Although a detection unit T<n> is described as an example in FIG. 5B, it should be clear to those skilled in the art that this is exemplary, and other shift register units may be used as the unit to be tested and a corresponding detection unit is provided adjacent to it as needed. For example, the shift register unit GOA<n+1> may also be used as the unit to be tested and a detection unit T<n+1> may be provided at the next stage of the shift register unit GOA<n+1>, which will not be repeated here.

Figure 6A:
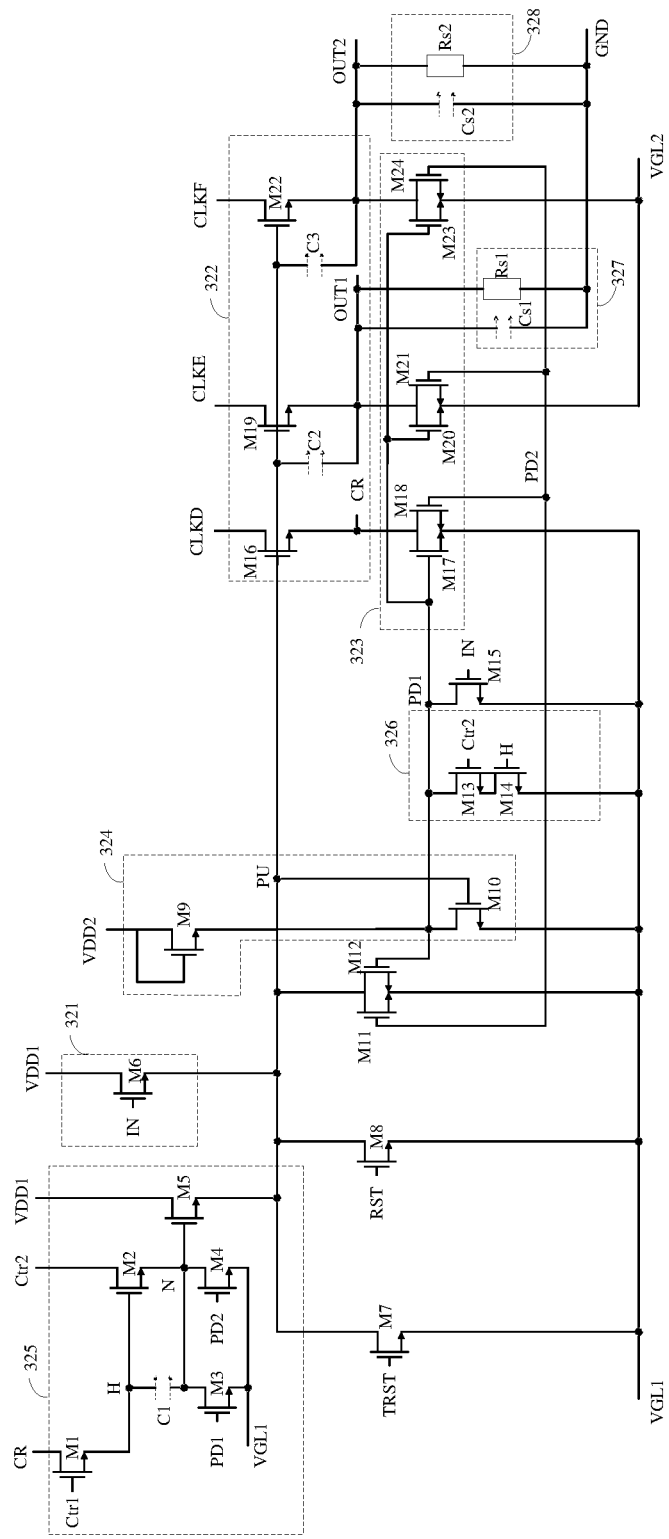
FIG. 6A shows a circuit diagram of an odd-numbered stage of shift register unit in the gate driving circuit of FIG. 5B.

FIG. 6A shows a circuit diagram of odd-numbered shift register units (for example, shift register units GOA<n−2>, GOA<n>, and GOA<n+2>) in the gate driving circuit of FIG. 5B.

As shown in FIG. 6A, the shift register unit includes an input sub-circuit 321, an output sub-circuit 322, a pull-down sub-circuit 323, and a pull-down control sub-circuit 324.

The input sub-circuit 321 is coupled to a pull-up node PU and an input signal terminal IN. The input sub-circuit 321 may receive an input signal from the input signal terminal IN and output the input signal to the pull-up node PU. In FIG. 6A, the input sub-circuit 321 includes a transistor M6, a gate of the transistor M6 is coupled to the input signal terminal IN, a first electrode is coupled to a first power signal terminal VDD1, and a second electrode is coupled to the pull-up node PU.

The output sub-circuit 322 is coupled to the pull-up node PU, a first clock signal terminal CLKD, a second clock signal terminal CLKE, a control output terminal CR, a first output signal terminal OUT1, and a second output signal terminal OUT2. The output sub-circuit 322 may generate a control output signal based on a signal from the first clock signal CLKD terminal under the control of the potential of the pull-up node PU to be output to the control output terminal CR, and generate a first output signal based on a signal form the second clock signal terminal CLKE to be output to the first output signal terminal OUT1. In some embodiments, the output sub-circuit 322 may also generate a second output signal based on a signal from the third clock signal terminal CLKF to be output to the second output signal terminal OUT2. In FIG. 6A, the output sub-circuit 322 includes transistors M16, M19, and M22, and capacitors C2 and C3. The gates of the transistors M16, M19, and M22 are all coupled to the pull-up node PU. A first electrode of the transistor M16 is coupled to the first clock signal terminal CLKD, and a second electrode of the transistor M16 is coupled to the control output terminal CR. A first electrode of the transistor M19 is coupled to the second clock signal terminal CLKE, and a second electrode of the transistor M19 is coupled to the first output signal terminal OUT1. A first electrode of the transistor M22 is coupled to the third clock signal terminal CLKF, and a second electrode of the transistor M22 is coupled to the second output signal terminal OUT2. A terminal of the capacitor C2 is coupled to the gate of the transistor M19, and another terminal of the transistor M19 is coupled to the first output signal terminal OUT1. A terminal of the capacitor C3 is coupled to the gate of the transistor M22, and another terminal of the capacitor C3 is coupled to the second output signal terminal OUT2.

The pull-down sub-circuit 323 is coupled to the control output terminal CR, the first output signal terminal OUT1, the second output signal terminal OUT2, a first pull-down node PD1, a second pull-down node PD2, a first reference signal terminal VGL1, and a second reference signal terminal VGL2. The pull-down sub-circuit 323 may pull down the potentials of the control output terminal CR, the first output signal terminal OUT1, and the second output signal terminal OUT2 to a reference level under the control of the potentials of the first pull-down node PD1 and the second pull-down node PD2. In FIG. 6A, the pull-down sub-circuit 323 includes transistors M17, M18, M20, M21, M23, and M24, where the gates of the transistors M17, M20, and M23 are coupled to the first pull-down node PD1, and the gates of the transistors M18, M21, and M24 are coupled to the second pull-down node PD2. The first electrodes of the transistors M17 and M18 are coupled to the first reference signal terminal VGL1, and the second electrodes of the transistors M17 and M18 are coupled to the control output terminal CR. The first electrodes of the transistors M20 and M21 are coupled to the second reference signal terminal VGL2, and the second electrodes of the transistors M20 and M21 are coupled to the first output signal terminal OUT1. The first electrodes of the transistors M23 and M24 are coupled to the second reference signal terminal VGL2, and the second electrodes of the transistors M23 and M24 are coupled to the second output signal terminal OUT2.

The pull-down control sub-circuit 324 is coupled to the pull-up node PU, the first pull-down node PD1, and the second power signal terminal VDD2. The pull-down control sub-circuit 324 may control the potential of the first pull-down node PD1 under the control of the potentials of the pull-up node PU and the second power signal terminal VDD2. In FIG. 6A, the pull-down control sub-circuit 324 includes transistors M9 and M10. A gate and a first electrode of the transistor M9 are coupled to the second power signal terminal VDD2, and a second electrode of the transistor M9 is coupled to the first pull-down node PD1. A gate of the transistor M10 is coupled to the pull-up node PU, a first electrode of the transistor M10 is coupled to the first reference signal terminal VGL1, and a second electrode of the transistor M10 is coupled to the first pull-down node PD1.

The first output signal terminal OUT1 is coupled to a first load circuit 327, and the second output signal terminal OUT2 is coupled to a second load circuit 328. As shown in FIG. 6A, the first load circuit 327 includes a capacitor Cs1 and a resistor Rs1 coupled in parallel between the first output signal terminal OUT1 and the ground terminal GND, and the second load circuit 328 includes a capacitor Cs2 and a resistor Rs2 coupled in parallel between the second output signal terminal OUT2 and the ground terminal GND.

The shift register unit of FIG. 6A may further include a first sensing control sub-circuit 325 and a second sensing control sub-circuit 326 for performing random sensing. The first sensing control sub-circuit 325 includes transistors M1, M2, M3, M4, and M5, and a capacitor C1. A gate of the transistor M1 is coupled to the first control signal terminal Ctr1, a first electrode of the transistor M1 is coupled to the control output terminal CR, and a second electrode of the transistor M1 is coupled to a node H. A gate of the transistor M2 is coupled to the node H, a first electrode of the transistor M2 is coupled to the second control signal terminal Ctr2, and a second electrode of the transistor M2 is coupled to a node N. A gate of the transistor T3 is coupled to the first pull-down node PD1, a first electrode of the transistor T3 is coupled to the first reference signal terminal VGL1, and a second electrode of the transistor T3 is coupled to the node N. A gate of the transistor M4 is coupled to the second pull-down node PD2, a first electrode of the transistor M4 is coupled to the first reference signal terminal VGL1, and a second electrode of the transistor M4 is coupled to the node N. A gate of the transistor M5 is coupled to the node N, a first electrode of the transistor M5 is coupled to the first power signal terminal VDD1, and a second electrode of the transistor M5 is coupled to the pull-up node PU. A terminal of the capacitor C1 is coupled to the node H, and another terminal of the capacitor C1 is coupled to the node N. The second sensing control sub-circuit 326 includes transistors M13 and M14. A gate of the transistor M13 is coupled to the second control signal terminal Ctr2, a first electrode of the transistor M13 is coupled to the first pull-down node PD1, and a second electrode of the transistor M13 is coupled to a second electrode of the transistor M14. A gate of the transistor M14 is coupled to the node H, and a first electrode of the transistor M14 is coupled to the first reference signal terminal VGL1.

The shift register unit of FIG. 6A may further include a reset circuit for resetting the pull-up node PU. The reset circuit includes transistors M7 and M8. A gate of the transistor M7 is coupled to the total reset signal terminal TRST, a first electrode is coupled to the first reference signal terminal VGL1, and a second electrode is coupled to the pull-up node PU. A gate of the transistor M8 is coupled to the reset signal terminal RST, a first electrode of the transistor M8 is coupled to the pull-up node PU, and a second electrode of the transistor M8 is coupled to the first reference signal terminal VGL1.

The shift register unit of FIG. 6A may further include a second pull-down sub-circuit for pulling down the pull-up node PU under the control of the first pull-down node PD1 and the second pull-down node PD2, and the second pull-down sub-circuit includes transistors M11 and M12. A gate of the transistor M11 is coupled to the second pull-down node PD2, a first electrode of the transistor M11 is coupled to the first reference signal terminal VGL1, and a second electrode of the transistor M11 is coupled to the pull-up node PU. A gate of the transistor M12 is coupled to the first pull-down node PD1, a first electrode of the transistor M12 is coupled to the first reference signal terminal VGL1, and a second electrode of the transistor M12 is coupled to the pull-up node PU.

The shift register unit of FIG. 6A may further include a transistor M15 for keeping the first pull-down node PD1 being at a low level when the input signal terminal IN is at a high level. A gate of the transistor M15 is coupled to the input signal terminal IN, a first electrode of the transistor M15 is coupled to the first reference signal terminal VGL1, and a second electrode of the transistor M15 is coupled to the first pull-down node PD1.

It can be seen from FIG. 6A that an abnormal potential of the first pull-down node PD1 may cause an abnormal output signal. For example, long-term operation of the transistor M9 under a positive bias voltage may cause a threshold voltage VTH of the transistor M9 to gradually shift in a forward direction. If the threshold voltage VTH of the transistor M9 shifts in the forward direction so large that the voltage of the first pull-down node PD1 is insufficient to turn on the transistors M17, M20, and M23, the levels of the output signal terminals OUT1 and OUT2 may not be pulled down, so that the accumulated noise may not be eliminated and the output signal is abnormal. Therefore, it is desirable to be able to detect that the potential of the first pull-down node PD1 is abnormal, and adjust the level of the second power signal terminal VDD2 accordingly, so that the potential of the first pull-down node PD1 returns to the normal range.

Similarly, abnormal potentials of the first output signal terminal OUT1 and the second output signal terminal OUT2 in FIG. 6A may also cause abnormal output signals. Therefore, it is expected to detect the abnormal potentials and adjust the potentials of clock signal terminals CLKE and CLKE accordingly, so that the potentials of the first output signal terminal OUT1 and the second output signal terminal OUT2 return to the normal range.

Figure 6B:
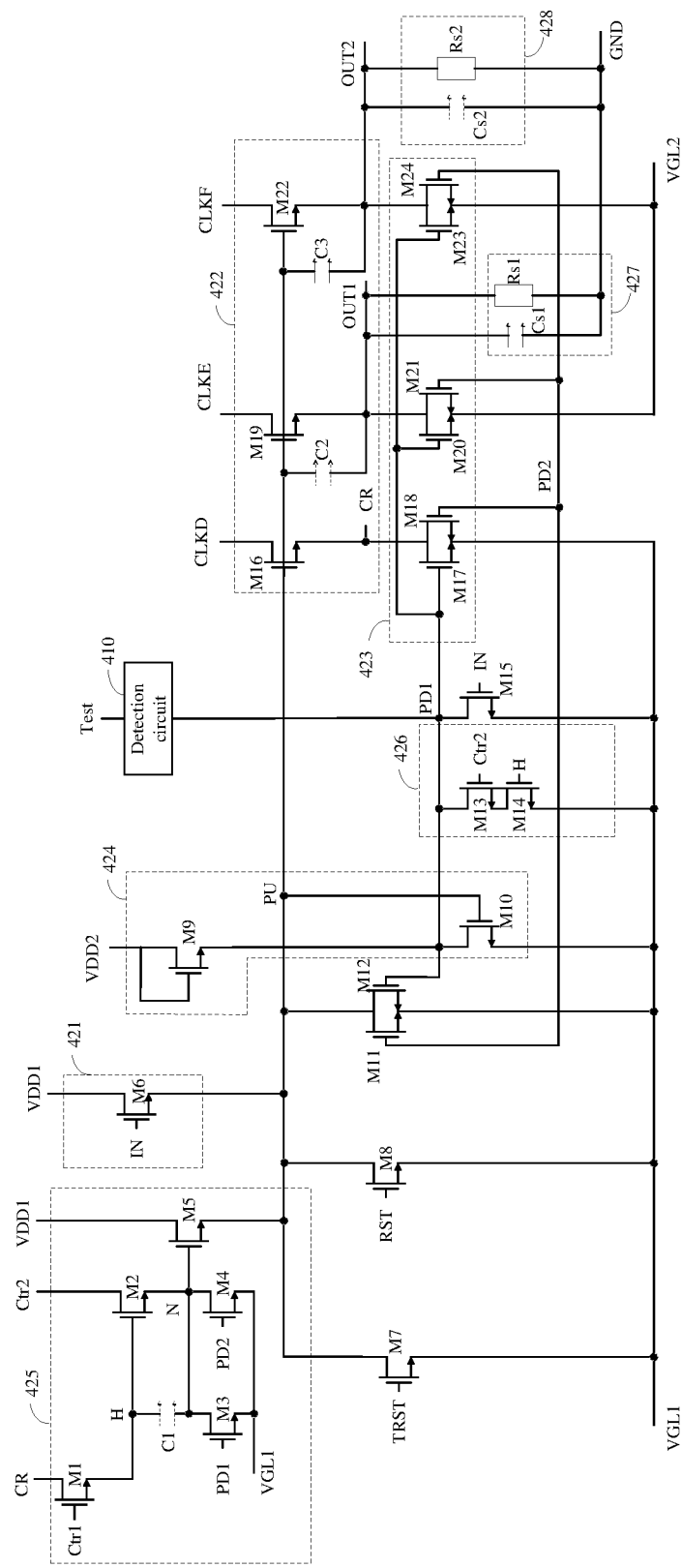
FIG. 6B shows a circuit diagram of an example of a detection unit adjacent to the shift register unit of FIG. 6A.

FIG. 6B shows a circuit diagram of an example of a detection unit adjacent to the shift register unit of FIG. 6A. For example, assuming that the shift register unit GOA<n> in FIG. 5B has the structure shown in FIG. 6A, the detection unit T<n> may have the structure shown in FIG. 6B.

As shown in FIG. 6B, the shift register unit used as the detection unit includes a shift register circuit and a detection circuit 410, and the structure of the shift register circuit is the same as the shift register circuit used as the unit to be tested in FIG. 6A. For example, the shift register circuit of the detection unit shown in FIG. 6B includes an input sub-circuit 421, an output sub-circuit 422, a pull-down sub-circuit 423, and a pull-down control sub-circuit 424, which have the same structures as the input sub-circuit 321, the output sub-circuit 322, the pull-down sub-circuit 323, and the pull-down control sub-circuit 324 in FIG. 6A, respectively. In addition, the shift register circuit of the detection unit shown in FIG. 6B includes a first sensing control sub-circuit 425 and a second sensing control sub-circuit 426, which have the same structures as the first sensing control sub-circuit 325 and the second sensing control sub-circuit 326 in FIG. 6A, respectively. In addition, the shift register circuit of the detection unit shown in FIG. 6B further includes a reset circuit (including transistors M7 and M8), a second pull-down sub-circuit (including transistors M11 and M12), and a transistor M15 with the same structures as that in FIG. 6A.

The detection circuit 410 is coupled to the first pull-down node PD1, and may generate a detection signal according to the potential of the first pull-down node PD1 to be output to the detection signal terminal Test.

The first output signal terminal OUT1 of the detection unit in FIG. 6B is coupled to the first load circuit 427, and the second output signal terminal OUT2 is coupled to the second load circuit 428. The first load circuit 427 in FIG. 6B has the same structure as the first load circuit 327 in FIG. 6A, and the second load circuit 428 in FIG. 6B has the same structure as the second load circuit 328 in FIG. 6A.

As the shift register circuit of the detection unit (such as the detection unit T<n> in FIG. 5B) and the unit to be tested (such as the shift register unit GOA<n> in FIG. 5B) adjacent to the detection unit have the same structure and signal terminals coupling mode, the level of the detection node in the detection unit may reflect the level of the corresponding detection node in the unit to be tested adjacent to it (for example, the level of the first pull-down node PD1 of the detection unit T<n> may reflect the level of the first pull-down node PD1 of the shift register unit GOA<n>), and thus the level of the corresponding signal terminal (for example, the second power signal terminal VDD2) of the shift register unit may be adjusted.

Figure 6C:
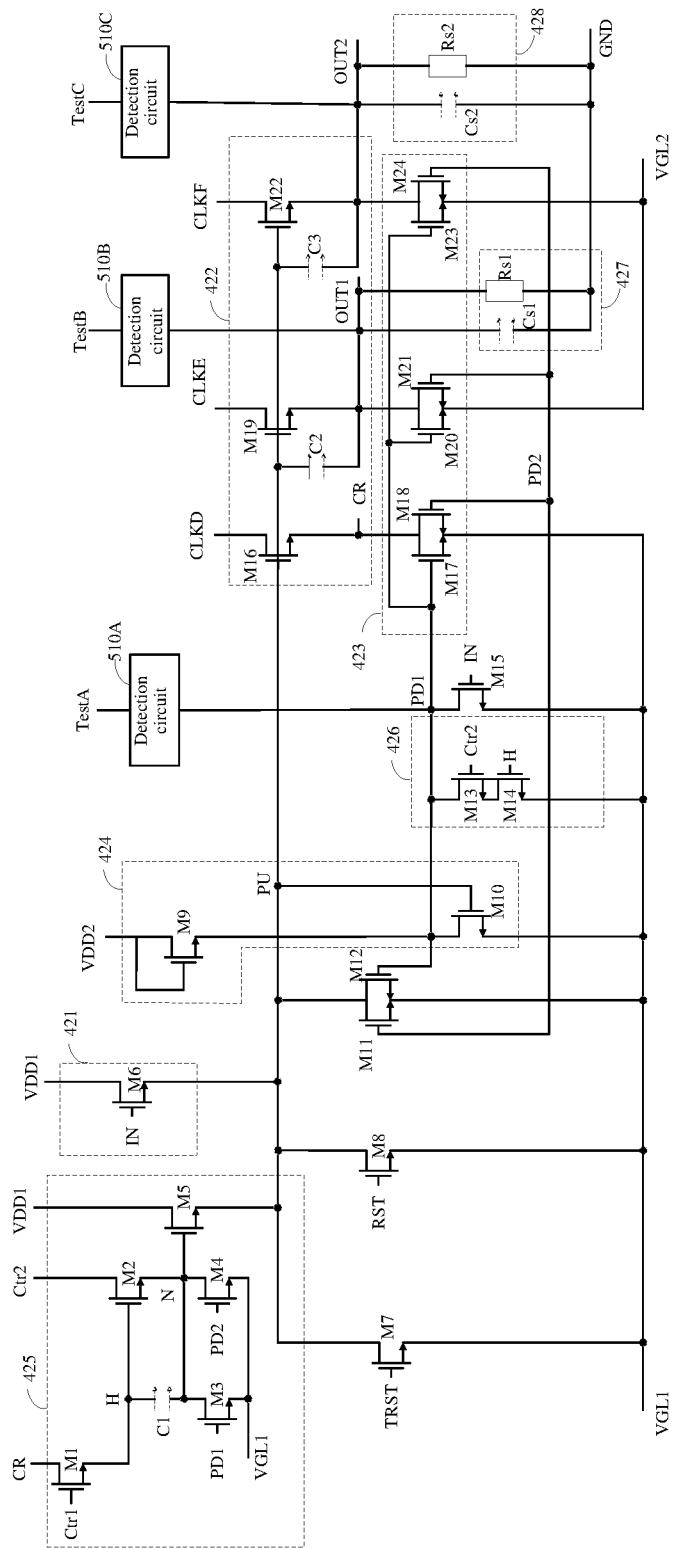
FIG. 6C shows a circuit diagram of another example of a detection unit adjacent to the shift register unit of FIG. 6A.

FIG. 6C shows a circuit diagram of another example of a detection unit adjacent to the shift register unit of FIG. 6A.

The structure of the detection unit of FIG. 6C is similar to that of FIG. 6B. The difference is at least that the detection unit of FIG. 6C includes three detection circuits, which are detection circuits 510A, 510B, and 510C. For the sake of brevity, the following mainly describes the different parts in detail.

As shown in FIG. 6C, the detection circuit 510A is coupled to the first pull-down node PD1, and may generate a first detection signal according to the potential of the first pull-down node PD1 to be output to the detection signal terminal TestA. The detection circuit 510B is coupled to the first output signal terminal OUT1, and may generate a second detection signal according to the potential of the first output signal terminal OUT1 to be output to the detection signal terminal TestB. The detection circuit 510C is coupled to the second output signal terminal OUT2, and may generate a third detection signal according to the potential of the second output signal terminal OUT2 to be output to the detection signal terminal TestC.

Figure 7A:
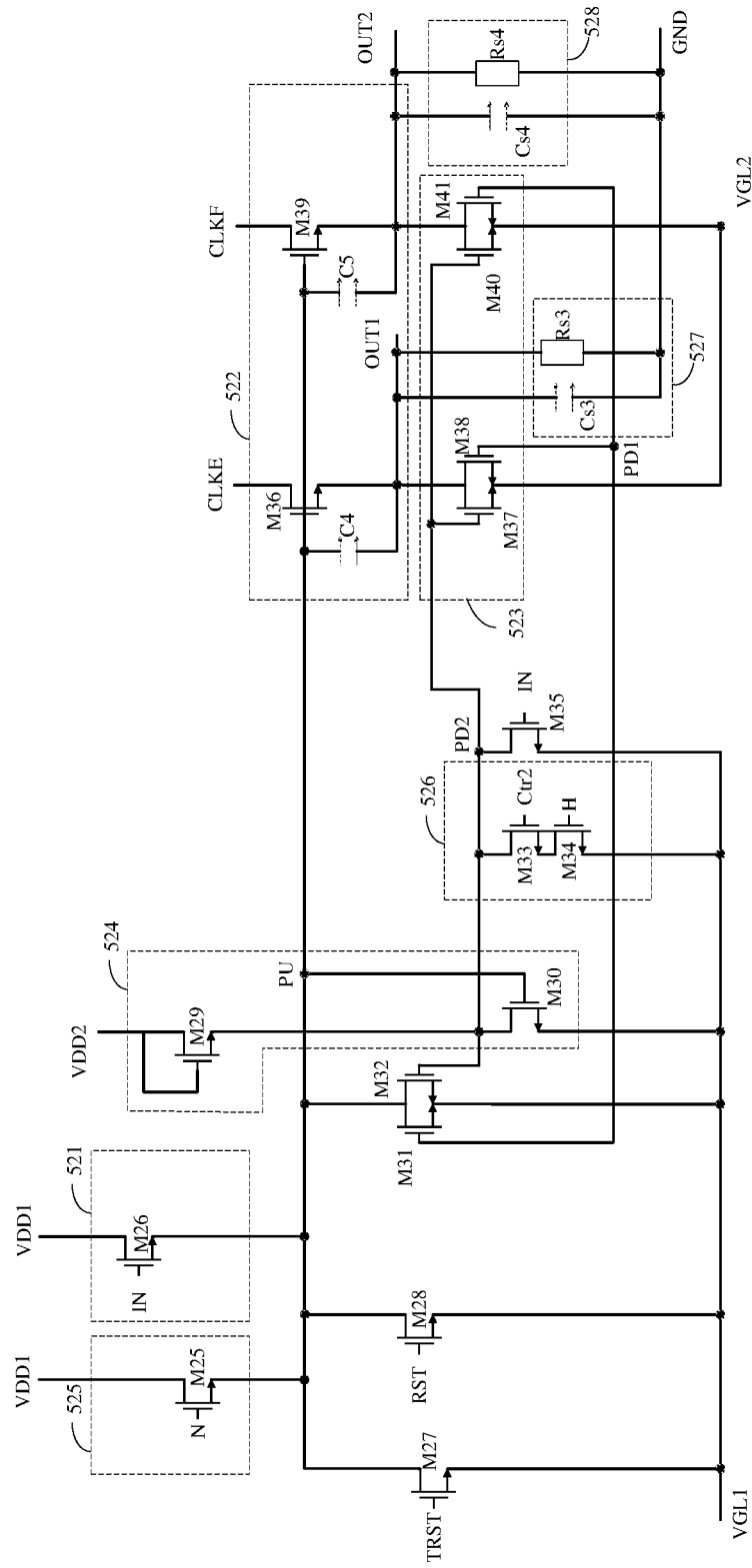
FIG. 7A shows an example circuit diagram of an even-numbered stage shift register unit in the gate driving circuit of FIG. 5B.

FIG. 7A shows an example circuit diagram of even-numbered shift register units (for example, shift register units GOA<n−1>, GOA<n+1>, and GOA<n+3>) in the gate driving circuit of FIG. 5B.

As shown in FIG. 7A, the shift register unit includes an input sub-circuit 521, an output sub-circuit 522, a pull-down sub-circuit 523, and a pull-down control sub-circuit 524.

The input sub-circuit 521 is coupled to the pull-up node PU and the input signal terminal IN. The input sub-circuit 521 may receive an input signal from the input signal terminal IN and output the input signal to the pull-up node PU. In FIG. 7A, the input sub-circuit 521 includes a transistor M26, a gate of the transistor M26 is coupled to the input signal terminal IN, a first electrode is coupled to the first power signal terminal VDD1, and a second electrode is coupled to the pull-up node PU.

The output sub-circuit 522 is coupled to the pull-up node PU, the second clock signal terminal CLKE, the first output signal terminal OUT1, and the second output signal terminal OUT2. The output sub-circuit 522 may generate a first output signal based on a signal from the second clock signal terminal CLKE under the control of the potential of the pull-up node PU to output the first output signal to the first output signal terminal OUT1. In some embodiments, the output sub-circuit 522 may also generate a second output signal based on a signal from the third clock signal terminal CLKF to output the second output signal to the second output signal terminal OUT2. In FIG. 7A, the output sub-circuit 522 includes transistors M36 and M39, and capacitors C4 and C5. Gates of the transistors M36 and M39 are both coupled to the pull-up node PU. A first electrode of the transistor M36 is coupled to the second clock signal terminal CLKE, and a second electrode of the transistor M36 is coupled to the first output signal terminal OUT1. A first electrode of the transistor M39 is coupled to the third clock signal terminal CLKF, and a second electrode of the transistor M39 is coupled to the second output signal terminal OUT2. A terminal of the capacitor C4 is coupled to the gate of the transistor M36, and another terminal of the capacitor C4 is coupled to the first output signal terminal OUT1. A terminal of the capacitor C5 is coupled to the gate of the transistor M39, and another terminal of the capacitor C5 is coupled to the second output signal terminal OUT2.

The pull-down sub-circuit 523 is coupled to the first output signal terminal OUT1, the second output signal terminal OUT2, the first pull-down node PD1, the second pull-down node PD2, and the second reference signal terminal VGL2. The pull-down sub-circuit 523 may pull down the potentials of the first output signal terminal OUT1 and the second output signal terminal OUT2 to a reference level under the control of the potentials of the first pull-down node PD1 and the second pull-down node PD2. In FIG. 7A, the pull-down sub-circuit 523 includes transistors M37, M38, M40, and M41, where gates of the transistors M38 and M41 are coupled to the first pull-down node PD1, and gates of the transistors M37 and M40 are coupled to the second pull-down node PD2. First electrodes of the transistors M37 and M38 are coupled to the second reference signal terminal VGL2, and second electrodes of the transistors M37 and M38 are coupled to the first output signal terminal OUT1. First electrodes of the transistors M40 and M41 are coupled to the second reference signal terminal VGL2, and second electrodes of the transistors M40 and M41 are coupled to the second output signal terminal OUT2.

The pull-down control sub-circuit 524 is coupled to the pull-up node PU, the second pull-down node PD2, and the second power signal terminal VDD2. The pull-down control sub-circuit 524 may control the potential of the second pull-down node PD2 under the control of the potentials of the pull-up node PU and the second power signal terminal VDD2. In FIG. 7A, the pull-down control sub-circuit 524 includes transistors M29 and M30. A gate and a first electrode of the transistor M29 are coupled to the second power signal terminal VDD2, and a second electrode of the transistor M29 is coupled to the second pull-down node PD2. A gate of the transistor M30 is coupled to the pull-up node PU, a first electrode of the transistor M30 is coupled to the first reference signal terminal VGL1, and a second electrode of the transistor M30 is coupled to the second pull-down node PD2.

The first output signal terminal OUT1 is coupled to a first load circuit 527, and the second output signal terminal OUT2 is coupled to a second load circuit 528. As shown in FIG. 7A, the first load circuit 527 includes a capacitor Cs3 and a resistor Rs3 coupled in parallel between the first output signal terminal OUT1 and the ground terminal GND, and the second load circuit 328 includes a capacitor Cs4 and a resistor Rs4 coupled in parallel between the second output signal terminal OUT2 and the ground terminal GND.

The shift register unit of FIG. 7A may further include a first sensing control sub-circuit 525 and a second sensing control sub-circuit 526 for performing random sensing. The first sensing control sub-circuit 525 includes a transistor M25. A gate of the transistor M25 is coupled to the node N of the shift register unit of the previous stage, a first electrode of the transistor M25 is coupled to the first power signal terminal VDD1, and a second electrode of the transistor M25 is coupled to the pull-up node. The second sensing control sub-circuit 526 includes transistors M33 and M34. A gate of the transistor M33 is coupled to the second control signal terminal Ctr2, a first electrode of the transistor M33 is coupled to the second pull-down node PD2, and a second electrode of the transistor M33 is coupled to the second electrode of the transistor M34. A gate of the transistor M34 is coupled to the node H of the shift register unit of the previous stage, and a first electrode of the transistor M34 is coupled to the first reference signal terminal VGL1.

The shift register unit of FIG. 7A may further include a reset circuit for resetting the pull-up node PU. The reset circuit includes transistors M27 and M28. A gate of the transistor M27 is coupled to the total reset signal terminal TRST, and a first electrode of the transistor M27 is coupled to the first reference signal terminal VGL1, a second electrode of the transistor M27 is coupled to the pull-up node PU. A gate of the transistor M28 is coupled to the reset signal terminal RST, a first electrode of the transistor M28 is coupled to the pull-up node PU, and a second electrode of the transistor M28 is coupled to the first reference signal terminal VGL1.

The shift register unit of FIG. 7A may further include a second pull-down sub-circuit for pulling down the pull-up node PU under the control of the first pull-down node PD1 and the second pull-down node PD2, and the second pull-down sub-circuit includes transistors M31 and M32. A gate of the transistor M31 is coupled to the first pull-down node PD1, a first electrode of the transistor M31 is coupled to the first reference signal terminal VGL1, and a second electrode of the transistor M31 is coupled to the pull-up node PU. A gate of the transistor M32 is coupled to the second pull-down node PD2, a first electrode of the transistor M32 is coupled to the first reference signal terminal VGL1, and a second electrode of the transistor M32 is coupled to the pull-up node PU.

The shift register unit of FIG. 7A may further include a transistor M35 for keeping the second pull-down node PD2 being at a low level when the input signal terminal IN is at a high level. A gate of the transistor M35 is coupled to the input signal terminal IN, a first electrode of the transistor M35 is coupled to the first reference signal terminal VGL1, and a second electrode of the transistor M35 is coupled to the second pull-down node PD2.

Similar to the situation of FIG. 6B, the first pull-down node PD1, the second pull-down node PD2, the first output signal terminal OUT1, and the second output signal terminal OUT2 of the shift register unit of FIG. 7A also have the above-mentioned abnormal voltage problem.

Figure 7B:
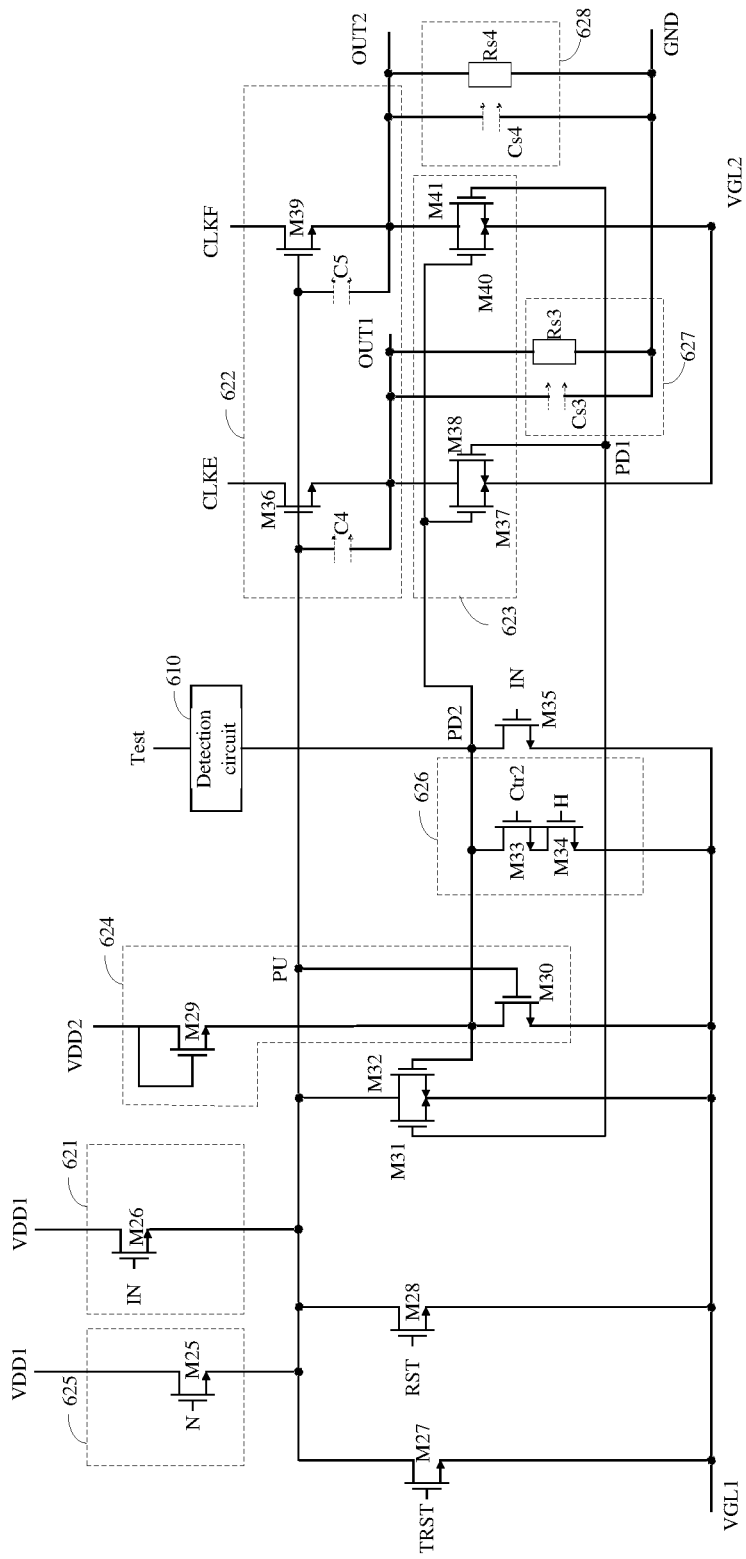
FIG. 7B shows an example circuit diagram of a detection unit adjacent to the shift register unit of FIG. 7A.

FIG. 7B shows a circuit diagram of an example of a detection unit adjacent to the shift register unit of FIG. 7A. For example, if the detection unit T<n+1> is provided at the next stage of the shift register unit GOA<n+1> in the gate driving circuit shown in FIG. 5B, the detection unit T<n+1> may have the structure shown in FIG. 7B.

As shown in FIG. 7B, the shift register unit used as the detection unit includes a shift register circuit and a detection circuit 610, and the structure of the shift register circuit is the same as that of the shift register circuit used as the unit to be tested in FIG. 7A. For example, the shift register circuit of the detection unit shown in FIG. 7B includes an input sub-circuit 621, an output sub-circuit 622, a pull-down sub-circuit 623, and a pull-down control sub-circuit 624, which have the same structures as the input sub-circuit 521, the output sub-circuit 522, the pull-down sub-circuit 523, and the pull-down control sub-circuit 524 in FIG. 7A, respectively. In addition, the shift register circuit of the detection unit shown in FIG. 7B includes a first sensing control sub-circuit 625 and a second sensing control sub-circuit 626, which have the same structures as the first sensing control sub-circuit 525 and the second sensing control sub-circuit 526 in FIG. 7A, respectively. In addition, the shift register circuit of the detection unit shown in FIG. 7B further includes a reset circuit (including transistors M27 and M28), a second pull-down sub-circuit (including transistors M31 and M32), and a transistor M35 with the same structure as that in FIG. 7A.

The detection circuit 610 is coupled to the second pull-down node PD2, and may generate a detection signal according to the potential of the second pull-down node PD2 to output the detection signal to the detection signal terminal Test.

The first output signal terminal OUT1 of the detection unit in FIG. 7B is coupled to the first load circuit 627, and the second output signal terminal OUT2 is coupled to the second load circuit 628. The first load circuit 627 in FIG. 7B has the same structure as the first load circuit 527 in FIG. 7A, and the second load circuit 628 in FIG. 7B has the same structure as the second load circuit 528 in FIG. 7A.

In addition, referring back to FIG. 5B, in the case that the odd-numbered shift register units have the structures shown in FIG. 6A and the even-numbered shift register units have the structures shown in FIG. 7A, the first pull-down node PD1 of the shift register unit GOA<n> is coupled to the first pull-down node PD1 of the shift register unit GOA<n+1>, and the second pull-down node PD2 of the shift register unit GOA<n> is coupled to the second pull-down node PD2 of the shift register unit GOA<n+1>, and the first pull-down node and the second pull-down node of the detection unit T<n> also adopt the same coupling mode as that of the shift register unit GOA<n>, and so on. In addition, in the case that the shift register unit also has the third clock signal terminal CLKF as shown in FIGS. 6A and 7A, the clock signals CLKF1, CLKF2, CLKF3, CLKF4, CLKF5, and CLKF6 may be coupled to the third clock signal terminal CLKF in a manner similar to that of the second clock signal terminal CLKE, and the third clock signal terminal CLKF of the detection unit correspondingly adopt the same coupling mode as the unit to be tested adjacent to it, which will not be repeated here.

Although the second pull-down node PD2 is described as the detection node in the above embodiment, it should be clear to those skilled in the art that the detection unit in FIG. 7B may also use other nodes as the detection node, for example, at least one of the first pull-down node PD1, the second pull-down node PD2, the first output signal terminal OUT1, and the second output signal terminal OUT2 serves as the detection node, which will not be repeated here.

Although the gate driving circuit with a specific structure is described above with reference to FIGS. 5A and 5B, and the shift register unit with a specific structure is described with reference to FIGS. 6A to 7B, the embodiments of the present disclosure are not limited thereto, and the shift register unit used as the detection unit may be applied to gate driving circuits with other structures, and may adopt other shift register circuit structures and coupling modes accordingly.

An embodiment of the present disclosure also provides a display device, which includes the above-mentioned gate driving circuit. This will be described in detail below with reference to FIGS. 8A and 8B.

Figure 8A:
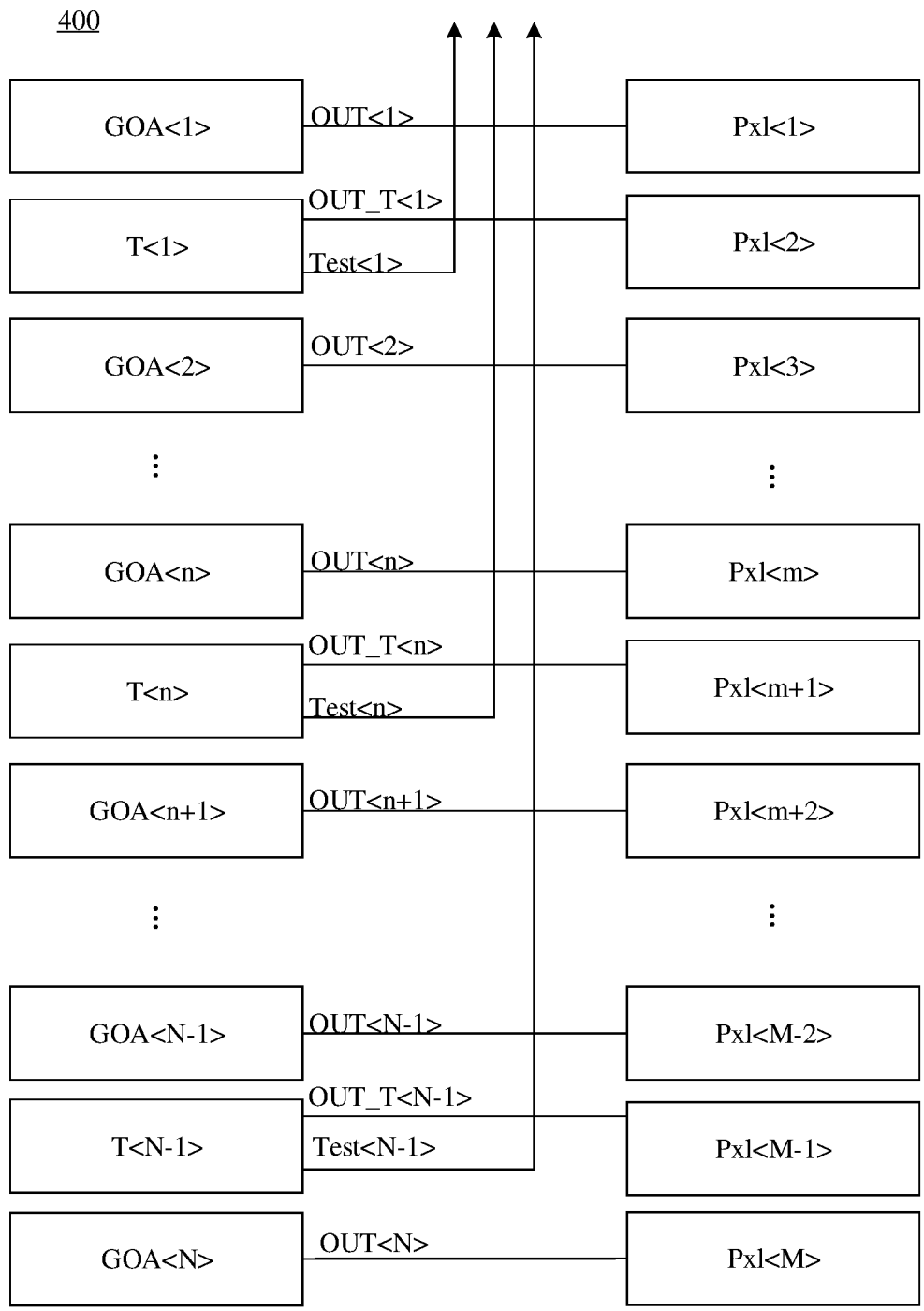
FIG. 8A shows a schematic diagram of a display device according to an embodiment of the present disclosure.

FIG. 8A shows a schematic diagram of a display device according to an embodiment of the present disclosure.

As shown in FIG. 8A, the display device 400 includes the aforementioned gate driving circuit and multiple rows of pixel units Px1<1>, Px1<2>, . . . , Px1<M>, where M is an integer greater than 1. The gate driving circuit includes N stages of cascaded shift register units GOA<1>, GOA<2>, . . . , GOA<N>, in which K detection units are inserted, and both K and N are integers greater than or equal to 1. In FIG. 8A, K=3, and the detection units T<1>, T<n>, and T<N−1> are provided at the next stages of the shift register units GOA<1>, GOA<n> and GOA<N−1>, respectively, where 1<n<N. The respective detection nodes of the detection units T<1>, T<n>, and T<N−1> do not include output signal terminals. For example, each of the detection units T<1>, T<n> and T<N−1> may have the structure shown in FIG. 6B or FIG. 7B.

The output signal terminal of the shift register unit GOA<1> is coupled to the first row of the pixel unit Px1<1> to provide the output signal OUT<1> thereto. The output signal terminal of the detection unit T<1> is coupled to the next row of the pixel unit of, that is, the second row of the pixel unit Px1<2>, to provide the output signal OUT_T<1> thereto. The detection unit T<1> also outputs a detection signal Test<1>, and the detection signal Test<1> carries information related to the potential of the corresponding node in the shift register unit GOA<1>.

The output signal terminal of the shift register unit GOA<2> is coupled to the third row of the pixel unit Px1<3> to provide the output signal OUT<2> thereto, and so on.

The output signal terminal of the shift register unit GOA<n> is coupled to the $m^{th}$ row of the pixel unit Px1<m> to provide the output signal OUT<n> thereto. The output signal terminal of the detection unit T<n> is coupled to the $(m+1)^{th}$ row of the pixel unit Px1<m+1> to provide the output signal OUT_T<n> thereto. The detection signal Test<n> output by the detection unit T<n> carries information related to the potential of the corresponding node in the shift register unit GOA<n>.

The output signal terminal of the shift register unit GOA<n+1> is coupled to the $(m+2)^{th}$ row of the pixel unit Px1<m+2> to provide the output signal OUT<n+1> thereto, and so on.

The output signal terminal of the shift register unit GOA<N-1> is coupled to the $(M-2)^{th}$ row of the pixel unit Px1<M-2> to provide the output signal OUT<N-1> thereto. The output signal terminal of the detection unit T<N-1> is coupled to the $(M-1)^{th}$ row of the pixel unit Px1<M-1> to provide the output signal OUT_T<N-1> thereto. The detection signal Test<N-1> output by the detection unit T<N-1> carries information related to the potential of the corresponding node in the shift register unit GOA<N-1>.

The output signal terminal of the shift register unit GOA<N> is coupled to the last row of the pixel unit Px1<M> to provide the output signal OUT<N> thereto.

In this way, the N+K stages of the output signal terminals of the gate driving circuit are respectively coupled to the M rows of pixel units.

Figure 8B:
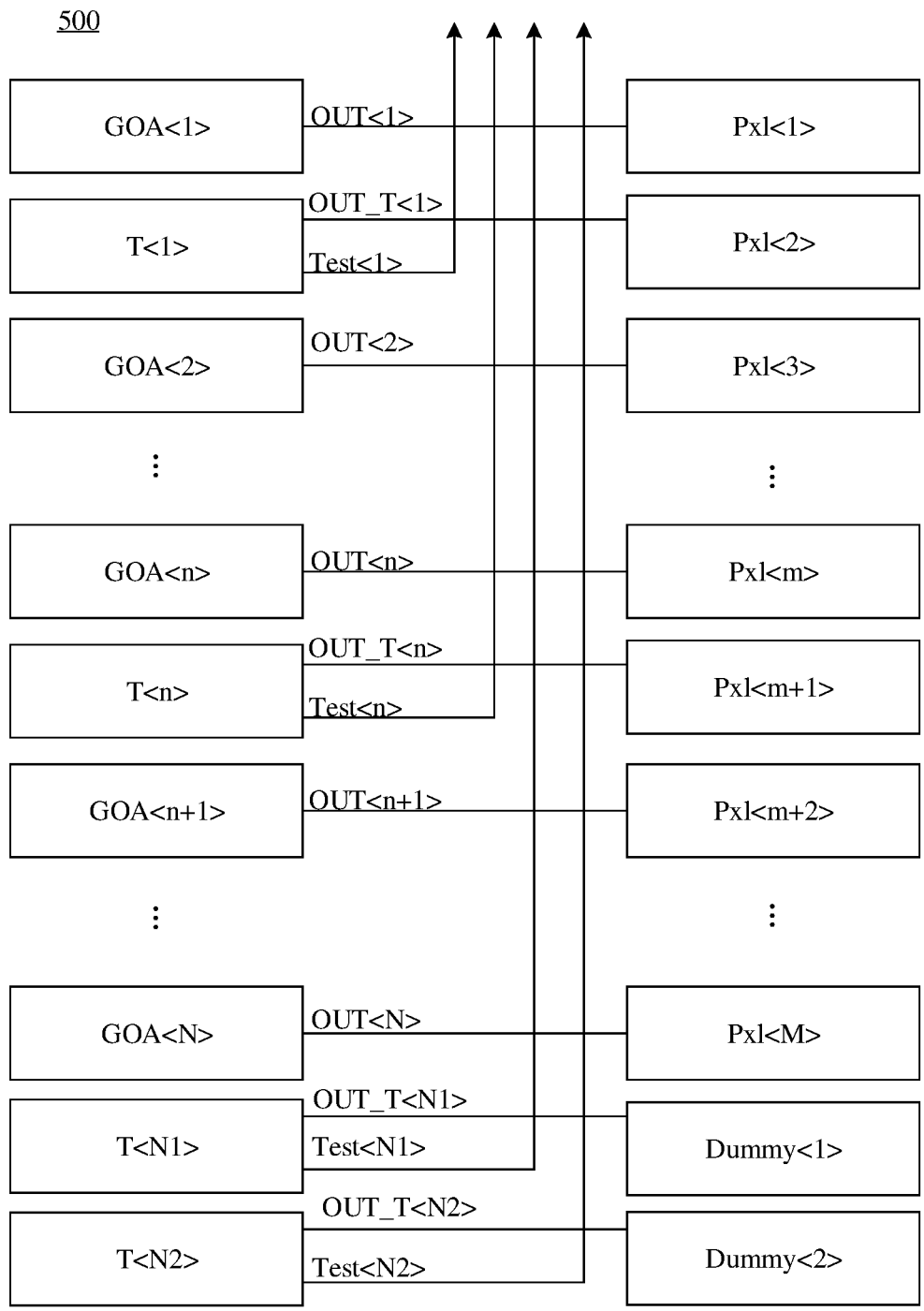
FIG. 8B shows a schematic diagram of a display device according to another embodiment of the present disclosure.

FIG. 8B shows a schematic diagram of a display device according to another embodiment of the present disclosure. The display device 500 of FIG. 8B is similar to the display device 400 of FIG. 8A, and the difference is at least that the detection units T<N1> and T<N2> are provided at the next stage of the last stage of the shift register unit GOA<N> in the gate driving circuit of FIG. 8B. The detection units T<N1> and T<N2> are respectively coupled to the auxiliary pixel rows Dummy<1> and Dummy<2>. For the sake of brevity, the following mainly describes the different parts in detail.

As shown in FIG. 8B, the gate driving circuit includes N stages of cascaded shift register units GOA<1>, GOA<2>, . . . , GOA<N>, in which four detection units are inserted, that is, the detection unit T<1> is provided at the next stage of the shift register unit GOA<1>, the detection unit T<n> is provided at the next stage of the shift register unit GOA<n>, and the detection units T<N1> and T<N2> are provided at the next stage of the shift register unit GOA<N>. The detection units T<1> and T<n> do not use output signal terminals as detection nodes. For example, each of the detection units T<1> and T<n> may have a structure as shown in FIG. 6B or FIG. 7B. The detection nodes of the detection units T<N1> and T<N2> include output signal terminals. For example, the detection units T<N1> and T<N2> may have a structure as shown in FIG. 6C.

The multiple rows of pixel units include multiple rows of display pixel units Px1 and multiple rows of auxiliary pixel units Dummy. M=N+2, M represents the number of rows of display pixel units, so that N stages of the shift register units GOA<1> to GOA<N> and the two detection units T<1> and T<n> inserted among them may be coupled to the M rows of display pixel units Px1<1>, Px1<2>, . . . , Px1<M>, respectively. The detection units T<N1> and T<N2> are coupled to two rows of auxiliary pixel units Dummy<1> and Dummy<2> provided at the next stage of the M rows of display pixel units, respectively.

By coupling the detection units T<N1> and T<N2> to the auxiliary pixel units Dummy<1> and Dummy<2>, it is possible to avoid affecting the display of the display pixel rows due to collect voltage at the output signal terminals of the detection units T<N1> and T<N2>.

Although the detection units T<N1> and T<N2> are provided at the next stage of the shift register unit GOA<N> in the above embodiments, in some embodiments, at least one of the detection unit T<N1> and the detection unit T<N2> is provided at the previous stage of the shift register unit GOA<1> to be coupled to the corresponding row of the auxiliary pixel unit provided at the previous stage of the first row of pixel unit Px1<1>.

Although the two detection units T<N1> and T<N2> are coupled to the auxiliary pixel unit row in the above embodiment, the embodiment of the present disclosure is not limited to this, and the number of detection units coupled to the auxiliary pixel unit row may be selected as needed.

The embodiment of the present disclosure also provides a compensation method applied to the gate driving circuit, which will be described in detail below with reference to FIGS. 9 to 11.

Figure 9:
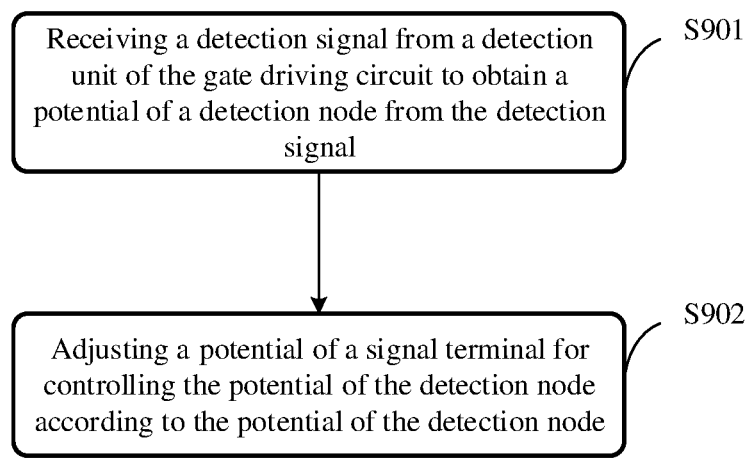
FIG. 9 shows a flowchart of a compensation method applied to a gate driving circuit according to an embodiment of the present disclosure.

FIG. 9 shows a flowchart of a compensation method applied to a gate driving circuit according to an embodiment of the present disclosure. The compensation method may be applied to the above described gate driving circuit.

In step S901, a detection signal is received from the detection unit of the gate driving circuit and a potential of the detection node is obtained from the detection signal.

In step S902, a potential of the signal terminal for controlling the potential of the detection node is adjusted according to the potential of the detection node. For example, if the detection node is the pull-down node of the shift register circuit in the detection unit, the power signal terminal of the shift register circuit in the detection unit is used as the signal terminal for controlling the potential of the detection node. If the detection node is the output signal terminal of the shift register circuit in the detection unit, the clock signal terminal of the shift register circuit in the detection unit is used as the signal terminal for controlling the potential of the detection node.

For example, assuming that the gate driving circuit has the layout shown in FIG. 8A and the signal terminals coupling mode shown in FIG. 5B, and each of the detection units T<1>, T<n>, and T<N-1> has the structure shown in FIG. 6B. In this case, a potential $V_{PD1\_}1$ of the first pull-down node PD1 of the shift register circuit in the detection unit T<1> may be obtained from the detection signal Test<1>, and the potential $V_{PD1\_}1$ reflects the potential of the first pull-down node PD1 of the shift register unit GOA<1>. Similarly, a potential $V_{PD1\_}2$ of the first pull-down node PD1 of the shift register unit GOA<n> may be obtained from the detection signal Test<n>; a potential $V_{PD1\_}3$ of the first pull-down node PD1 of the shift register unit GOA<N−1> may be obtained from the detection signal Test<N−1>. The potentials of the signal terminals used to control the potentials of the first pull-down nodes PD1 in the detection units T<1>, T<n>, and T<N−1> based on the potentials $V_{PD1}\_1$, $V_{PD1}\_2$, and $V_{PD1}\_3$ may be adjusted. For example, the potentials of the second power signal terminal VDD2 of the detection units T<1>, T<n>, and T<N−1> are adjusted. As the detection unit has the same signal terminals coupling mode as that of the unit to be tested adjacent to it, adjusting the potential of certain signal terminal in the detection unit may realize the adjustment of the potential of corresponding signal terminal of the corresponding shift register unit in the gate driving circuit. For example, for the gate driving circuit structure shown in FIG. 5B, the potentials of the second power signal terminals VDD2 in the detection units T<1>, T<n>, and T<N−1> are adjusted by adjusting the level of the power signal VDD_A, and thus the potentials of the second power signal terminals VDD2 of all shift register units (i.e., odd-numbered stages of the shift register units) coupled to receive the power signal VDD_A are adjusted.

For example, assuming that the gate driving circuit has the layout shown in FIG. 8B and the signal terminals coupling mode shown in FIG. 5B, the detection units T<1> and T<n> have the structures shown in FIG. 6B, and the detection units T<N1> and T<N2> have the structures shown in FIG. 6C. In this case, a potential $V_{PD1}\_1$ of the first pull-down node PD1 of the shift register unit GOA<1> may be obtained from the detection signal Test<1>; a potential $V_{PD1}\_2$ of the first pull-down node PD1 of the shift register unit GOA<n> may be obtained from the detection signal Test<n>; a potential $V_{PD1}\_3$ of the first pull-down node PD1, a potential $V_{OUT1}\_1$ of the first output signal terminal OUT1, and a potential $V_{OUT2}\_1$ of the second output signal terminal OUT2 of the shift register unit GOA<N> may be obtained from the detection signal Test<N1>; a potential $V_{PD1}\_4$ of the first pull-down node PD1, a potential $V_{OUT1}\_2$ of the first output signal terminal OUT1, and a potential $V_{OUT2}\_2$ of the second output signal terminal OUT2 of the shift register unit GOA<N> may be obtained from the detection signal Test<N2>. The potential of the second power signal terminal VDD2 may be adjusted based on the potentials $V_{PD1}\_1$, $V_{PD1}\_2$, $V_{PD1}\_3$, and $V_{PD1}\_4$ of the first pull-down node PD1, and the potential of the second clock signal terminal CLKE may be adjusted based on the potentials $V_{OUT1}\_1$ and $V_{OUT1}\_2$ of the first output signal terminal OUT1, and the potential of the third clock signal terminal CLKF may be adjusted based on the potentials $V_{OUT2}\_1$ and $V_{OUT2}\_2$ of the second output signal terminal OUT2.

Figure 10:
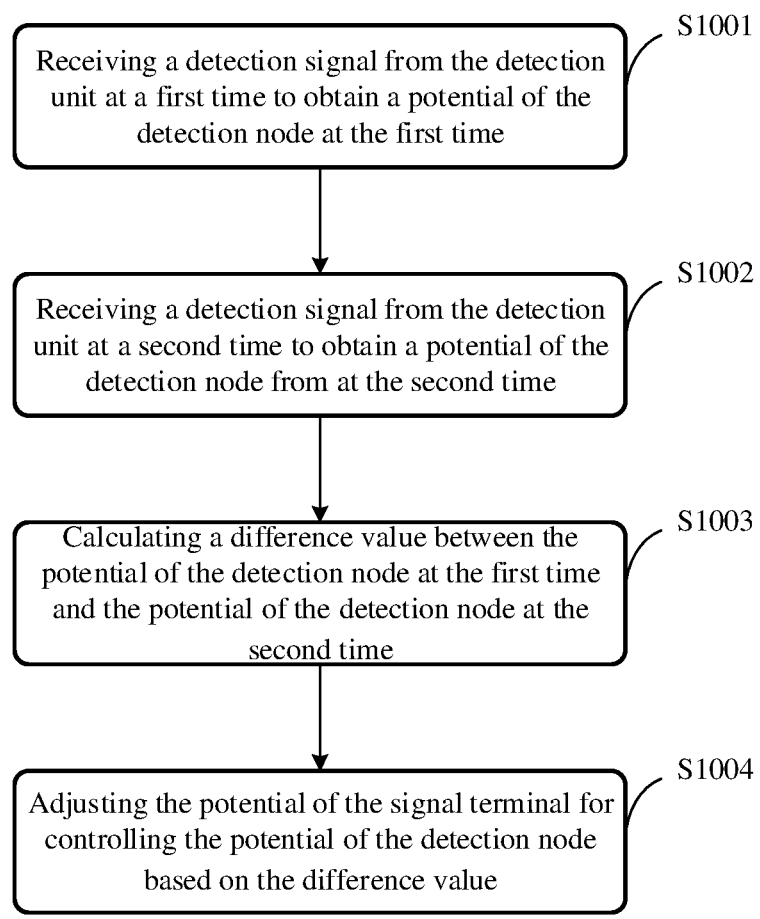
FIG. 10 shows a flowchart of an example of a compensation method applied to a gate driving circuit according to an embodiment of the present disclosure.

FIG. 10 shows a flowchart of an example of a compensation method applied to a gate driving circuit according to an embodiment of the present disclosure. In this embodiment, the gate driving circuit adopts one detection unit. The following describes the gate driving circuit shown in FIG. 5B as an example, where the gate driving circuit of FIG. 5B adopts one detection unit T<n> having the structure shown in FIG. 6B.

In step S1001, a detection signal is received from the detection unit at the first time to obtain a potential of the detection node at the first time. For example, it is possible to receive the detection signal Test<n> from the detection unit T<n> at time t1 to obtain the potential $V_{PD1}\_11$ of the first pull-down node PD1 in the detection unit T<n> at time t1 from the detection signal Test<n>, and the potential $V_{PD1}\_11$ may reflect the potential of the first pull-down node PD1 in the shift register unit GOA<n>.

In step S1002, a detection signal is received from the detection unit at the second time to obtain a potential of the detection node at the second time. For example, the detection signal Test<n> is received from the detection unit T<n> at time t2 to obtain a potential $V_{PD1}\_12$ of the first pull-down node PD1 in the detection unit T<n> at time t2 from the detection signal Test<n>.

The above described steps S1001 and S1002 may be implemented by controlling the switch sub-circuit in the detection circuit. For example, a switch signal is used to turn on the switch sub-circuit at times t1 and t2, so that the sample and hold sub-circuit collects the voltage from the detection node P.

In step S1003, a difference value between the potential of the detection node at the first time and the potential of the detection node at the second time is calculated. For example, $V_{PD1}\_11-V_{PD1}\_12$ is calculated.

In step S1004, a potential of the signal terminal for controlling the potential of the detection node is adjusted based on the difference value. For example, the potential of the second power signal terminal VDD2 in the detection unit T<n> may be adjusted (i.e., the level of the power signal VDD_A is adjusted), so that when the potential of the first pull-down node PD1 decreases, the potential Va of the second power signal terminal VDD2 rises, and the potential of the first pull-down node PD1 returns to a higher potential, and vice versa. For example, assuming that the current potential of the second power signal terminal VDD2 is Va, the potential of the second power signal terminal VDD2 may be adjusted to Va+($V_{PD1}\_11-V_{PD1}\_12$). Va is usually a positive voltage, and the above adjustment method is also applicable to the situation where Va is a negative voltage, and is also applicable to other signal terminals, which will not be repeated here.

Figure 11:
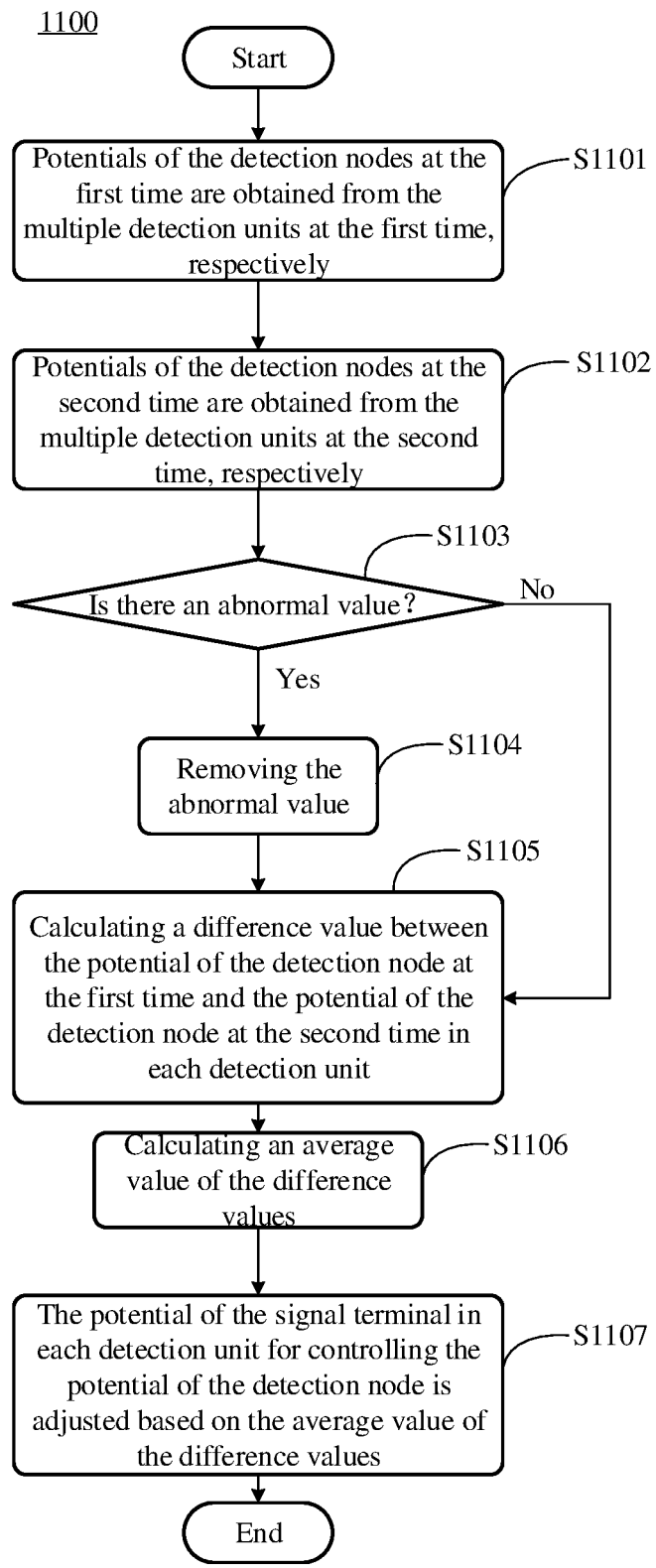
FIG. 11 shows a flowchart of another example of a compensation method applied to a gate driving circuit according to an embodiment of the present disclosure.

FIG. 11 shows a flowchart of another example of a compensation method applied to a gate driving circuit according to an embodiment of the present disclosure. In this embodiment, the gate driving circuit adopts multiple detection units. The following describes the gate driving circuit shown in FIG. 5B as an example, where the gate driving circuit of FIG. 5B adopts three detection units T<1>, T<n>, and T<N> as shown in FIG. 8A, and the detection units T<1>, T<n>, and T<N> have the structure shown in FIG. 6B.

In step S1101, potentials of the detection nodes at the first time are obtained from the multiple detection units at the first time. For example, the potentials $V_{PD1}\_11$, $V_{PD1}\_21$, and $V_{PD1}\_31$ of the first pull-down nodes PD1 at time t1 are obtained from the detection signals Test<1>, Test<n>, and Test<N>, respectively.

In step S1102, potentials of the detection nodes at the second time are obtained from the multiple detection units at the second time. For example, the potentials $V_{PD1}\_12$, $V_{PD1}\_22$, and $V_{PD1}\_32$ of the first pull-down nodes PD1 at time t2 are obtained from the detection signals Test<1>, Test<n>, and Test<N>, respectively.

In step S1103, it is judged whether there is an abnormal value in the obtained potentials, if so, step S1104 is executed, otherwise, step S1105 is executed. For example, each of the potentials $V_{PD1}\_11$, $V_{PD1}\_21$, $V_{PD1}\_31$, $V_{PD1}\_12$, $V_{PD1}\_22$, and $V_{PD1}\_32$ may be compared with a predetermined threshold, and if it is higher or lower than the predetermined threshold, it is determined that the potential is an abnormal value, and then the step S1104 is executed, otherwise it is determined that the potential is a normal value, and the step S1105 is executed. As another example, in this step, it may be determined whether each of the potentials $V_{PD1\_11}$, $V_{PD1\_21}$, $V_{PD1\_31}$, $V_{PD1\_12}$, $V_{PD1\_22}$, and $V_{PD1\_32}$ falls within the predetermined threshold range. If so, it is determined that the potential is a normal value, and the step S1105 is executed, otherwise it is determined that the potential is an abnormal value, and the step S1104 is executed.

In step S1104, the abnormal value is removed from the set of obtained potentials. For example, if it is determined in step S1103 that the potential $V_{PD1\_21}$ from the detection unit T<n> is an abnormal value, the potential $V_{PD1\_21}$ from the detection unit T<n> may be removed from the set of the above six potentials, so that it will not be used in subsequent calculations. In this embodiment, as the potential difference value is to be used later instead of a single potential value, the two potentials $V_{PD1\_21}$ and $V_{PD1\_22}$ from the detection unit T<n> may be removed from the set.

In step S1105, the difference value between the potential of the detection node at the first time and the potential of the detection node at the second time in each detection unit is calculated. Assuming that the potential $V_{PD1\_21}$ and the potential $V_{PD1\_22}$ are removed in step S1104, $V_{PD1\_11}-V_{PD1\_12}$ and $V_{PD1\_31}-V_{PD1\_32}$ are calculated in this step.

In step S1106, an average value of the difference values is calculated. For example, $(V_{PD1\_11}-V_{PD1\_12}+V_{PD1\_31}-V_{PD1\_32})/2$ is calculated.

In step S1107, the potential of the signal terminal in each detection unit for controlling the potential of the detection node is adjusted based on the average value of the difference values. For example, the potential of the second power signal terminal VDD2 in the detection units T<1>, T<n>, and T<N> may be adjusted (i.e., the level of the power signal VDD_A is adjusted). Assuming that the current potential of the power signal VDD_A is Va, the potential of the power signal VDD_A may be adjusted to $Va+(V_{PD1\_11}-V_{PD1\_12}+V_{PD1\_31}-V_{PD1\_32})/2$.

In some embodiments, steps S1103 and S1104 may be performed at any other time before step S1106. For example, steps S1103 and S1104 may be executed after step S1105. In this case, three difference values $(V_{PD1\_11}-V_{PD1\_12})$, $(V_{PD1\_21}-V_{PD1\_22})$, and $(V_{PD1\_3}-V_{PD1\_32})$ are calculated in step S1105, and then it is determined in step S1103 whether each of the three difference values exceeds the predetermined threshold value range, if yes, the difference value is considered to be an abnormal value, and the difference value as an abnormal value is removed in step S1104, and then step S1106 is executed.

Although the pull-down node has been described as an example in the above embodiment as a detection node, the embodiment of the present disclosure is not limited to this. In the case that the detection node includes other nodes (such as the output signal terminal), a similar method may be used for calculation and compensation. For example, for the gate driving circuit shown in FIG. 8B, if the detection units T<1> and T<n> use the first pull-down node PD1 as the detection node, and the detection units T<N1> and T<N2> use the first pull-down node PD1 and the first output signal terminal OUT1 as detection nodes, the potentials of the first output signal terminal OUT1 at two different times may be obtained from the detection units T<N1> and T<N2>, and the potential of the second clock signal terminal CLKE is adjusted based on this, which will not be repeated here.

The compensation method applied to the gate driving circuit in the embodiments of the present disclosure may be executed by hardware, software or a combination thereof, for example, it may be executed by a Field Programmable Gate Array (FPGA) or an Application Specific Integrated Circuit (ASIC).

The embodiment of the present disclosure also provides a driving method of the gate driving circuit, which will be described in detail below with reference to FIG. 12 and FIG. 13.

Figure 12:
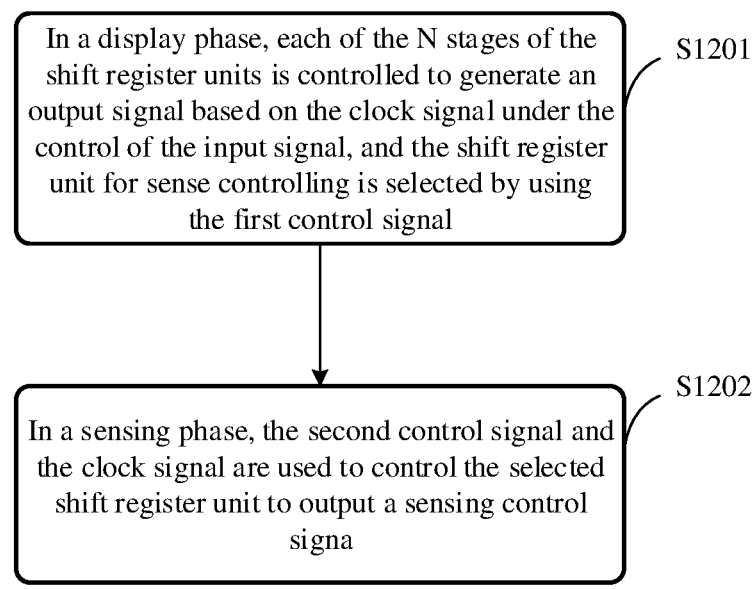
FIG. 12 shows a flowchart of a driving method of a gate driving circuit according to an embodiment of the present disclosure.

FIG. 12 shows a flowchart of a driving method of a gate driving circuit according to an embodiment of the present disclosure.

In step S1201, in a display phase, each of the N stages of the shift register units is controlled to generate an output signal based on the clock signal under the control of the input signal, and the shift register unit for sense controlling is selected by using the first control signal. At this phase, the detection unit has a same operation manner as the unit to be tested adjacent to it, and the generated output signals are also the same. The output signal generated by the detection unit is provided to the adjacent row of pixel units, and the resulting display effect is also the same as that of the unit to be tested.

In step S1202, in a sensing phase, the selected shift register unit is controlled to output a sensing control signal by using the second control signal and the clock signal. At this phase, if the selected shift register unit is provided with a detection unit adjacent to it, the detection unit operates in a same operation manner as the unit to be tested adjacent to it, and thus generates the same sensing control signal as the sensing control signal generated by the unit to be tested.

Figure 13:
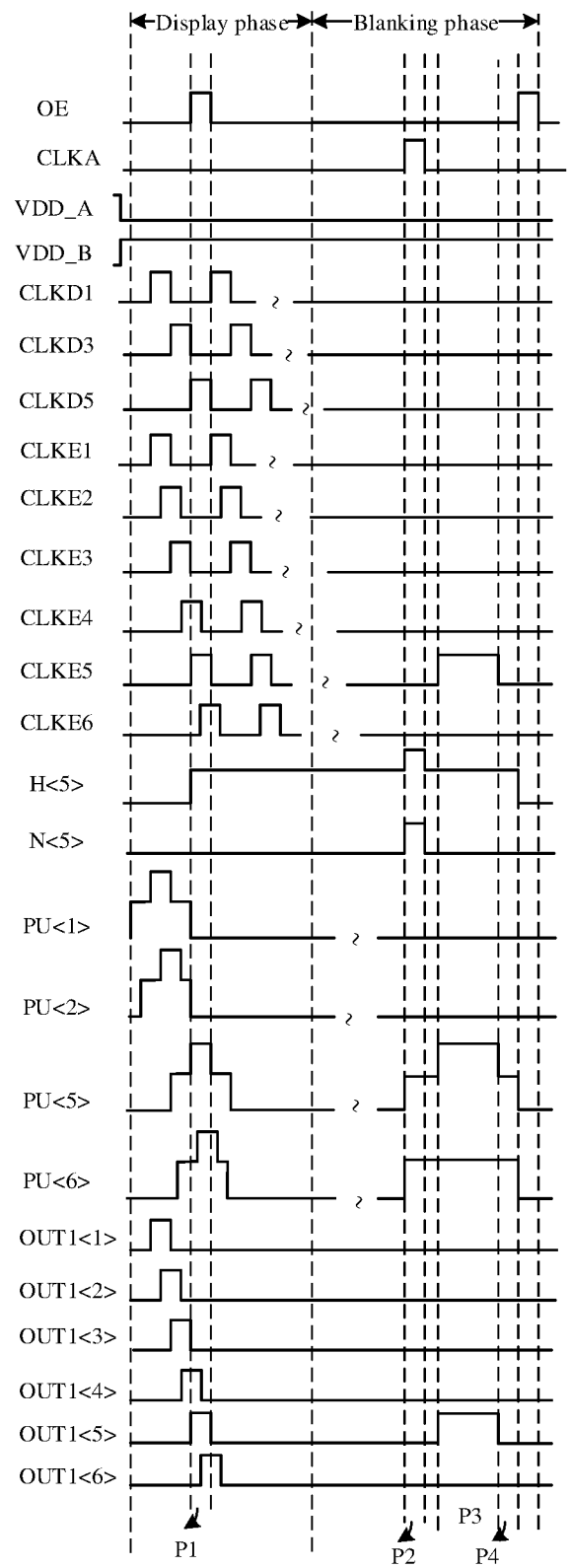
FIG. 13 shows a signal timing diagram of a driving method of a gate driving circuit according to an embodiment of the present disclosure.

FIG. 13 shows a signal timing diagram of a driving method of a gate driving circuit according to an embodiment of the present disclosure. This driving method is suitable for the above-mentioned gate driving circuit. Hereinafter, the gate driving circuit described above with reference to FIGS. 5A to 7B will be described as an example, where the odd-numbered stage of shift register unit has the structure shown in FIG. 6B or FIG. 6C, and the even-numbered stage of shift register unit has the structure shown in FIG. 7B. The structure shown. For the sake of brevity, FIG. 13 only shows the signal timings for the shift register units of the first to sixth stages.

In the display phase, the shift register units GOA<1> to GOA<6> generate the output signals OUT1<1> to OUT1<6> based on the clock signals CLKD1, CLKD3, CLKD5, CLKE1, CLKE2, CLKE3, CLKE4, CLKE5, and CLKE6 under the control of the potential of the input signal terminal in each of the shift register units GOA<1> to GOA<6>. For the sake of brevity, the output signals OUT1<1> to OUT1<6> of the first output signal terminal OUT1 is taken as an example for description. The output signal of the second output signal terminal OUT2 is generated in a similar manner, and will not be repeated here. In a period P1, the first control signal OE and the output signal OUT1<5> of the fifth stage of the shift register unit GOA<5> are both at a high level, which makes the transistor M1 of the shift register unit GOA<5> turn on, and the high level is written into the node H<5>. Due to the existence of the capacitor C1, even the first control signal OE and the output signal OUT1<5> change to be at a low level after the period P1, the node H<5> remains at the high level, thereby the shift register unit GOA<5> is selected as a shift register unit for sensing control.

A blanking phase includes periods P2, P3, and P4.

In period P2, the second control signal CLKA changes to be at a high level, and the high level of the node H<5> in the shift register unit GOA<5> turns on the transistors M2 and M5, so that the high level is written into the pull-up node PU<5>. The conduction of the transistor M2 also causes the node N<5> to change to be at the high level. Due to the bootstrap effect of the capacitor C1, the high level of the node N<5> further increases the level of the node H<5>. The high level of the pull-up node PU<5> turns on the transistors M16, M19, and M22 to wait for the arrival of the clock signal.

In period P3, the clock signal CLKE5 is at a high level. As the transistors M16, M19, and M22 of the shift register unit GOA<5> at this time are turned on, so that the high level of the clock signal CLKE5 is written into the output signal terminal (the first output signal terminal OUT1 in FIG. 6B) of the shift register unit GOA<5>, so that the shift register unit GOA<5> outputs a high-level output signal OUT1<5>. Moreover, due to the bootstrap effect of the capacitors C2 and C3, the high level of the output signal OUT1<5> further increases the level of the pull-up node PU<5>.

In period P4, the clock signal CLKE5 changes to be at a low level. As the transistors M16, M19 and M22 of the shift register unit GOA<5> at this time are turned on, so that the low level of the clock signal CLKE5 is written into the output signal terminal of the shift register unit GOA<5>, the output signal OUT1<5> changes to be at the low level. Thus, the output of the sensing control signal is completed.

For the unselected shift register unit, as the high level is not written into the node H in the unselected shift register unit during the display phase, the high level may not be written into the pull-up node PU through the transistors M2 and M5 during the blanking phase, and thus the output signal may not be generated.

In the foregoing embodiment, the second clock signal terminal CLKE is taken as an example for description. The signal timing of the third clock signal terminal CLKF is similar to that of the second clock signal terminal CLKE, and will not be repeated here.

Those skilled in the art may understand that the embodiments described above are all exemplary, and those skilled in the art may improve them, and the structures described in the various embodiments may be freely combined without conflicts in structure or principle.

After describing the preferred embodiments of the present disclosure in detail, those skilled in the art may clearly understand that various modifications and changes may be made without departing from the scope and spirit of the appended claims, and the present disclosure is not limited to the implementation of the exemplary embodiments listed in the specification.

What is claimed is:

1. A shift register unit, comprising:
    a shift register circuit having a detection node, the shift register circuit is configured to receive an input signal and a clock signal, and generate an output signal based on the clock signal under control of the input signal; and
    a detection circuit coupled to the detection node of the shift register circuit, the detection circuit is configured to generate a detection signal based on a potential of the detection node.

2. The shift register unit according to claim 1, wherein the detection circuit comprises:
    a sample and hold sub-circuit coupled to the detection node, the sample and hold sub-circuit is configured to sample and hold the potential of the detection node to obtain a sample signal; and
    an analog-to-digital conversion sub-circuit configured to perform analog-to-digital conversion on the sample signal from the sample and hold sub-circuit to obtain the detection signal.

3. The shift register unit according to claim 2, wherein the detection circuit further comprises:
    a switch sub-circuit coupled between the sample and hold sub-circuit and the detection node, the switch sub-circuit is configured to connect the sample and hold sub-circuit with the detection node or disconnect the sample and hold sub-circuit from the detection node, under a control of a switching signal.

4. A gate driving circuit, comprising:
    N stages of cascaded shift register units, at least one shift register unit of the N stages of cascaded shift register units is used as a unit to be tested, wherein N is an integer greater than 1;
    wherein at least one detection unit, with each detection unit being implemented by the shift register unit according to claim 2, is provided adjacent to each unit to be tested, each unit to be tested has a same structure as that of the shift register circuit of the detection unit adjacent to said each unit to be tested, and each unit to be tested is coupled in the same manner as the shift register circuit of the detection unit adjacent to said each unit to be tested, in terms of signal terminals except for output signal terminal.

5. The shift register unit according to claim 1, wherein shift register unit comprises a plurality of detection circuits and a plurality of detection nodes coupled in a one-to-one correspondence, each detection circuit is configured to generate the detection signal based on the potential of the detection node coupled to the detection circuit.

6. The shift register unit according to claim 1, wherein the shift register circuit comprises:
    an input sub-circuit coupled to a pull-up node and an input signal terminal of the shift register circuit, the input sub-circuit is configured to receive an input signal from the input signal terminal and output the input signal to the pull-up node;
    an output sub-circuit coupled to the pull-up node, and an clock signal terminal and an output signal terminal of the shift register circuit, the output sub-circuit is configured to receive a clock signal from the clock signal terminal, and provide an output signal to the output signal terminal based on the received clock signal under a control of a potential of the pull-up node;
    a pull-down sub-circuit coupled to the output signal terminal and a pull-down node of the shift register circuit, the pull-down sub-circuit is configured to control a potential of the output signal terminal under a control of a potential of the pull-down node; and
    a pull-down control sub-circuit coupled to the pull-up node, the pull-down node, and a power signal terminal, the pull-down control sub-circuit is configured to control the potential of the pull-down node under the control of the potential of the pull-up node and a potential of the power signal terminal.

7. The shift register unit according to claim 6, wherein the detection node comprises at least one of the pull-down node and the output signal terminal of the shift register circuit.

8. A gate driving circuit, comprising:
    N stages of cascaded shift register units, at least one shift register unit of the N stages of cascaded shift register units is used as a unit to be tested, wherein N is an integer greater than 1;
    wherein at least one detection unit, with each detection unit being implemented by the shift register unit according to claim 1, is provided adjacent to each unit to be tested, each unit to be tested has a same structure as that of the shift register circuit of the detection unit adjacent to said each unit to be tested, and each unit to be tested is coupled in the same manner as the shift register circuit of the detection unit adjacent to said each unit to be tested, in terms of signal terminals except for output signal terminal.

9. The gate driving circuit according to claim 8, wherein a detection unit with output signal terminal being detection node is provided at a next stage of an $N^{th}$ stage of the shift register unit, or provided at a previous stage of a first stage of the shift register unit.

10. The gate driving circuit according to claim 8, wherein each detection unit is coupled to a load circuit at the output signal terminal of the shift register circuit in said detection unit, and the load circuit has a same structure as that of a load circuit coupled to the unit to be tested adjacent to said detection unit.

11. The gate driving circuit according to claim 8, wherein the gate driving circuit comprises a plurality of units to be tested, the plurality of units to be tested are distributed among a head portion, a middle portion, and a tail portion of the N stages.

12. A display device comprising: the gate driving circuit according to claim 8.

13. The display device according to claim 12, further comprising: a plurality of rows of pixel units coupled to a plurality of output signal terminals in the gate driving circuit respectively, wherein the output signal terminal of each detection unit is coupled to a row of pixel units adjacent to a row of pixel units coupled to an output signal terminal of a corresponding unit to be tested.

14. The display device according to claim 13, wherein the a plurality of rows of pixel units comprises a plurality of rows of display pixel units and a plurality of rows of auxiliary pixel units, wherein a signal output terminal of the detection unit with output signal terminal being detection node is coupled to a corresponding row of auxiliary pixel units.

15. A compensation method applied to the gate driving circuit according to claim 8, comprising:
receiving a detection signal from a detection unit of the gate driving circuit to obtain a potential of a detection node from the detection signal; and
adjusting a potential of a signal terminal for controlling the potential of the detection node according to the potential of the detection node.

16. The compensation method according to claim 15, wherein receiving a detection signal from a detection unit of the gate driving circuit to obtain a potential of a detection node from the detection signal comprises:
receiving a detection signal from the detection unit of the gate driving circuit at a first time to obtain a potential of the detection node at the first time from the received detection signal; and
receiving a detection signal from the detection unit of the gate driving circuit at a second time to obtain a potential of the detection node at the second time from the received detection signal.

17. The compensation method according to claim 16, wherein the gate driving circuit comprises one detection unit, and adjusting a potential of a signal terminal for controlling the potential of the detection node according to the potential of the detection node comprises:
calculating a difference value between the potential of the detection node at the first time and the potential of the detection node at the second time; and
adjusting the potential of the signal terminal for controlling the potential of the detection node based on the difference value.

18. The compensation method according to claim 16, wherein the gate driving circuit comprises a plurality of detection units, each detection unit comprises one or more types of detection nodes, and adjusting a potential of a signal terminal for controlling the potential of the detection node according to the potential of the detection node comprises: for each type of detection node,
calculating a difference value between a potential of said each type of detection node at the first time and a potential of said each type of detection node at the second time in each detection unit;
averaging difference values of the plurality of detection units to obtain an average value of the difference values; and
adjusting the potential of the signal terminal for controlling the potential of the type of detection node in each detection unit based on the average value of the difference values.

19. The compensation method according to claim 18, wherein adjusting a potential of a signal terminal for controlling the potential of the detection node according to the potential of the detection node further comprises:
before averaging difference values of the plurality of detection units, determining whether the potential of the detection node obtained from each detection unit exceeds a predetermined range, and if the potential of the detection node obtained from each detection unit exceeds the predetermined range, determining that the potential of the detection node obtained from the detection unit is an abnormal value and removing the abnormal value.

20. The compensation method according to claim 15, wherein:
if the detection node is a pull-down node of the shift register circuit, a power signal terminal in the shift register circuit is determined as the signal terminal for controlling the potential of the detection node;
if the detection node is an output signal terminal of the shift register circuit, a clock signal terminal of the shift register circuit is determined as the signal terminal for controlling the potential of the detection node.

* * * * *